United States Patent [19]

Yoshizawa et al.

[11] Patent Number: 5,145,552
[45] Date of Patent: Sep. 8, 1992

[54] PROCESS FOR PREPARING ELECTRICAL CONNECTING MEMBER

[75] Inventors: Tetsuo Yoshizawa, Yokohama; Toyohide Miyazaki, Inashiki; Hiroshi Kondo, Osaka; Takashi Sakaki, Tokyo; Yoshimi Terayama, Odawara; Yoichi Tamura, Tokyo; Takahiro Okabayashi, Tokyo; Kazuo Kondo, Tokyo; Yasuo Nakatsuka, Tokyo; Yuichi Ikegami, Osaka, all of Japan

[73] Assignee: Canon Kabushiki Kaisha, Tokyo, Japan

[21] Appl. No.: 630,881

[22] Filed: Dec. 20, 1990

[30] Foreign Application Priority Data

| Dec. 21, 1989 | [JP] | Japan | 1-334100 |
| Dec. 22, 1989 | [JP] | Japan | 1-333055 |
| Dec. 26, 1989 | [JP] | Japan | 1-338941 |
| Mar. 16, 1990 | [JP] | Japan | 2-67812 |
| Mar. 16, 1990 | [JP] | Japan | 2-67813 |
| Mar. 16, 1990 | [JP] | Japan | 2-67814 |
| Mar. 16, 1990 | [JP] | Japan | 2-67815 |
| Mar. 16, 1990 | [JP] | Japan | 2-67816 |
| Mar. 16, 1990 | [JP] | Japan | 2-67817 |
| Mar. 16, 1990 | [JP] | Japan | 2-67819 |
| Apr. 6, 1990 | [JP] | Japan | 2-92731 |
| Aug. 2, 1990 | [JP] | Japan | 2-206387 |
| Aug. 3, 1990 | [JP] | Japan | 2-207467 |
| Aug. 3, 1990 | [JP] | Japan | 2-207468 |

[51] Int. Cl.$^5$ .................... B44C 1/22; B29C 37/00
[52] U.S. Cl. .................... 156/638; 156/643; 156/644; 156/645; 156/651; 156/656; 156/661.1; 156/668
[58] Field of Search ......... 156/630, 638, 643, 644, 156/645, 651, 652, 655, 656, 659.1, 661.1, 668; 430/296, 312, 313, 314, 317, 318; 204/15, 129.1, 129.65

[56] References Cited

U.S. PATENT DOCUMENTS

| 4,604,160 | 8/1986 | Murakami et al. | 156/630 |
| 4,814,040 | 3/1989 | Ozawa | 156/634 |
| 4,878,990 | 11/1989 | Dugan et al. | 156/630 |
| 4,926,549 | 5/1990 | Yoshizawa et al. | 29/876 |
| 5,058,800 | 10/1991 | Yoshizawa et al. | 228/180.2 |

FOREIGN PATENT DOCUMENTS

59-996 1/1984 Japan .

*Primary Examiner*—William A. Powell
*Attorney, Agent, or Firm*—Fitzpatrick, Cella, Harper & Scinto

[57] ABSTRACT

A process for preparing an electrical connecting member having a holding member comprises an electrically insulating material, a plurality of electroconductive members equipped in the holding member under the state mutually insulated from each other, one end of the each electroconductive member being exposed at one surface of the holding member, and the other end of the each electroconductive member being exposed at the other surface of the holding member, the process comprising the steps of:

(A) constituting a matrix member by providing a photosensitive resin which becomes the holding member on both surfaces of a base member, respectively;

(B) exposing and developing the respective photosensitive resins to form a plurality of holes through the photosensitive resins, thereby having the base member exposed;

(C) curing the photosensitive resins;

(D) etching away a part of the base member exposed;

(E) filling an electroconductive member into the holes formed in the holding members coplanar with or protruded from the holding members; and (F) removing the base member which remains.

100 Claims, 21 Drawing Sheets

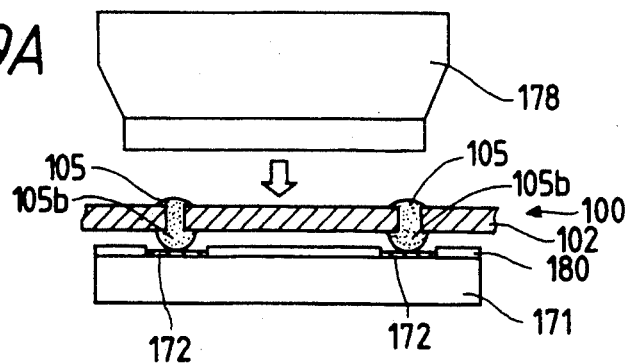
FIG. 29A
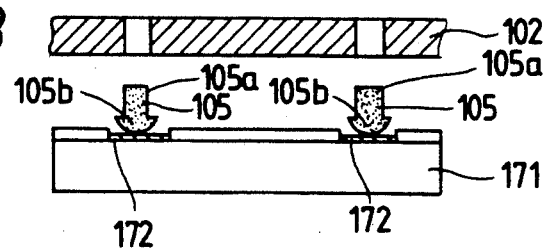
FIG. 29B
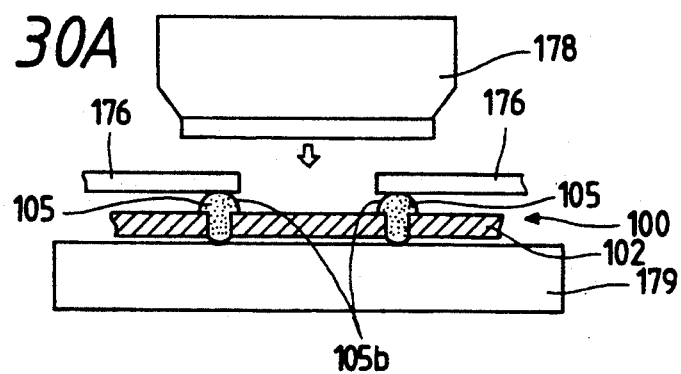
FIG. 30A
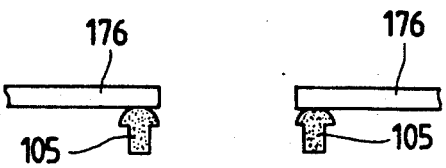
FIG. 30B

PROCESS FOR PREPARING ELECTRICAL CONNECTING MEMBER

BACKGROUND OF THE INVENTION

1. Field of the Invention

This invention relates to a process for preparing an electrical connecting member to be used in connecting electrically electrical circuit parts to each other.

2. Related Background Art

In the prior art, as the method for connecting electrically electrical circuit parts to each other, there have been known the wire bonding method, TAB (Tape Automated Bonding) method, etc. However, in these methods, there have been involved the drawbacks that they cannot correspond to the increase of connecting points between the both electrical circuit parts, and are also high in cost. In order to solve such drawbacks, there has been known in the art to connect electrical circuit parts to each other by use of an electrical connecting member having a constitution equipped with a plurality of electroconductive members insulated from each other in an insulating holding member (Japanese Laid-open Patent Applications Nos. 63-222437, 63-224235, etc.).

FIGS. 1A and 1B illustrate schematically electrical connection between the electrical circuit parts by use of such electrical connecting member, and in the FIG. 31 shows the electrical connecting member, and 32, 33 show the electrical circuit parts to be connected. The electrical connecting member 31 is constituted of a plurality of electrical members 34 comprising a metal or an alloy equipped in the holding member 36 comprising an electrically insulating material wherein the electroconductive members 34 are electrically insulated from each other, and has one end 38 of the electroconductive member 34 exposed on one electrical circuit part 32 side, and the other end 39 of the electroconductive member 34 exposed on the other electrical circuit part 33 side (FIG. 1A). To the connecting portion 36 of one electrical circuit part 32 is bonded one end 38 exposed on the electrical circuit part 32 side of the electroconductive member 34 by alloy formation, and to the connecting portion 37 of the other electrical circuit part 33 is bonded the other end 39 exposed on the electrical circuit part 33 side of the electroconductive member 34 by alloy formation (FIG. 1B).

In such electrical connecting member, there are the advantages as shown below.

(1) By making the size of the electroconductive member finer, the connecting portion of the electrical circuit part can be made compact, and also for such reason, the connecting points can be increased, whereby higher density connection mutually between electrical circuit parts can be done.

(2) Even for electrical circuit parts with different thickness, the height of the electrical circuit parts can be made always constant by varying the thickness of the electrical connecting member, whereby multi-layer connection can be done easily to enable higher density practical mounting.

(3) By making the protruded height of the electroconductive member to be connected with the connecting portion of the electrical circuit part higher, even one with the connecting portion of the electrical circuit part sunk from the surface can be stably connected, whereby it is possible to connect electrical circuit parts easily with complicated shapes to each other.

(4) Since the heat generated from the electrical circuit parts is radiated through the holding member of the electrical connecting member, the electrical characteristic change is extremely small. Also, because of excellent characteristic of radiation of heat, the influence of thermal fatigue is small and reliability is also high. At this time, the holding member may be also constituted of an insulating material in which high thermal conductive metals or ceramics are mixed, and by use of insulating ceramics with high thermal conductivity, its effects becomes greater.

(5) Since the connecting length in connection mutually between the electrical circuit parts is short, impedance can be reduced and speed-up of electrical parts can be effected. By mixing a metal with low dielectric constant, etc. into the holding member, impedance can be further lowered.

As the process for preparing the electroconductive member as described above for performing electrical multi-point connection mutually between electrical circuit parts, there is one proposed in Japanese Laid-open Patent Application No. 02-49385. In the following, this preparation process is described briefly by referring to FIGS. 2A to 2F showing schematically its steps.

First, a base member 51 comprising a metal sheet such as copper foil, etc. is prepared (FIG. 2 A), and on the base member 51 is coated a photosensitive resin 52 by a spin coater, which is then pre-backed at a temperature around 100° C. (FIG. 2B). Through a photomask forming a predetermined pattern (not shown), light is irradiated (exposed) on the photosensitive resin 52, followed by developing. At the irradiated portion, the photosensitive resin 52 remains, while at the unirradiated portion, the photosensitive resin 52 is removed by the development, whereby a plurality of holes 53 are formed (FIG. 2C). After curing the photosensitive resin 52 by elevating the temperature to 200° to 400° C., the base member 51 is dipped in an etchant to effect etching, thereby forming concavities 54 communicated to the holes 53 on the base member 51 (FIG. 2D). This etching is chemical etching by use of a general etchant such as cupric chloride, ammonium persulfate, ferric chloride, etc. Next, by application of gold plating with the base member 51 as the common electrode, gold 55 is filled into the holes 53, the concavities 54, and the gold plating is continued until bumps are formed (FIG. 2E). Here, as the means for performing gold plating, there have been known the following methods:

(1) the method by use of a mesh electrode as the counter electrode (FIG. 3A).

(2) the method by use of a foil electrode as the counter electrode (FIG. 3B).

(3) the method by use of an electrode provided with a plurality of nozzles as the counter electrode (jet stream system plating system) (FIG. 3C);

(4) the method disclosed in Japanese Patent Publication No. 57-9636.

Finally, the base member 51 is removed by etching to prepare an electrical connecting member 31 (FIG. 2F).

In the electrical connecting member 31 thus prepared, the gold 55 constitutes the electroconductive member 34, and the photosensitive resin the holding member 35. The dimensions of the respective portions in the electrical connecting member 31 are made about 10 μm for the thickness of the photosensitive resin 52

(holding member 35), about 20 μm for the diameter of the hole (electroconductive member 34), about 40 μm for pitch, and about several μm for protruded amount at both front and back of the electroconductive member 34.

However, in the preparation process of the prior art proposed in Japanese Laid-open Patent Application No. 02-49385 as described above, for mass production of electrical connecting members with uniform protruded shape and size of the bumps, the problems to be solved as described below remain and there was left room to be further improved.

Because electrical connecting members are prepared only on surface of the base member, during the steps of partial etching for formation of concavities and gold plating for filing gold, the other surface has been masked. Such masking necessitated batch treatment one sheet by one sheet, whereby there have been involved the problem that the treatment speed in etching, gold plating steps which are especially time consuming steps are very slow.

There also ensued such problems that etchant penetrated through slight gaps in such masking to each abnormally the base member, or that gold plating liquid was penetrated through the gaps to effect abnormal growth of gold (electroconductive member) by the change in current density, or that the base member cannot be removed because gold was precipitated on the other surface of the base member.

The base member has the function as the base foil for coating a photosensitive resin thereon, the function as the mold which becomes the protruded shape of the electroconductive member and the function as the common electrode for gold plating during formation of an electroconductive member, respectively, in every step, which, however, were not essentially required for the electrical connecting member finally prepared. Moreover, the thickness of the base member necessary as the mold in protruded shape of electroconductive member is about some μm, which means that only a little portion of the thickness of the substrate as a whole is utilized, and most portions have been discarded without use. Therefore, there has been involved the problem that the production cost was high on account of such many superfluous steps.

Mass production of electrical connecting members with uniform protruded height and protruded amount of the respective electroconductive members depends on the skill of electroplating in the preparation steps of electrical connecting members, but there have been involved such problems as shown below.

In the methods of (1) and (2), it is difficult to control the plating amount, whereby the plating thickness and plating shape in the respective pores are ununiform, and the protruded height and the protruded amount are uniform in the respective electroconductive members. Particularly, such tendency is marked when forming fine electroconductive members.

In the method of (3), although high speed plating is possible, since the flow speed is different between the central portion and the peripheral portion of the matrix member, and also between the portion against which the jet stream from nozzles comes and the portion positioned between adjoining nozzles, the plating thickness does not become uniform. Particularly, such tendency is marked when forming fine electroconductive members.

In the method of (4), it is not necessarily possible to accomplish layering of plating liquid, and in such case, the protruded height of the respective electroconductive members may be sometimes ununiform. Also, the apperatus constitution is bulky, which poses a problem particularly in that the matrix member to be foild is of large scale. Further, when impurities are entrained in the plating liquid, it is necessary to exchange frequently the plating liquid, resulting in increased cost.

Thus, the respective electroplating methods employed in the art had the problems as described above.

On the other hand, for controlling the protruded shape of the electroconductive member, a metal sheet constituted of a laminate comprising a plurality of layers with different materials may be sometimes used. In such case, if an etchant having a constant etching speed in the respective layers is employed, there has been the problem that the protruded shape of the electroconductive member can be controlled with difficulty, unless the etching conditions in the respective layers are changed.

The photosensitive resin 52 to be coated on the base member 51 comprising a metal sheet is a liquid resing containing a solvent, and the film thickness of the photosensitive resin 52 differs before curing and after curing due to dissipation of the solvent and curing shrinkage of the resin itself. Therefore, when the photosensitive resin 52 is coated with the same thickness as the desired film thickness of the holding member 35, there has been involved the problem that no holding member 35 with the disired film thickness could be obtained.

Further, in the preparation steps of electrical connecting members when the energy density of exposure is high, in nega-type photosensitive resin, the residula resin tends to become smaller in amount, while when the exposure energy density is lower, in the nega-type photosensitive resin, the residual resin tends to become larger in amount, whereby there has been involved the problem that no hole with desired shape can be formed after developing. On the other hand, when the developing time is long, in the nega-type photosensitive resin, the residual resin tends to become smaller in amount, while when the developing time is short, the portion to be removed by developing remains, whereby there has been involved the problem that no hole with desired shape can be formed.

Further, in the preparation process of the prior art, the concavities 54 are formed by etching the surface of the base member 51 comprising a metal sheet exposed within the holes 53 of the holding member as the mask, but if the photosensitive resin 52 is thick, etchant is liable to reside in the holes 53, and hydrogen gas generated during etching is adsorved as bubbles on the base member 51 surface to cover thereover and inhibit contact with the etchant or circulation of the etchant and therefore the etching speed is slow, whereby there were problems that the shapes of the concavities 54, and hence the protruded portion shapes of the bumps were ununiform and also electrical characteristics were not stabilized, etc. Residence of the etchant within the holes 53 will also cause resinous residue to be formed at the bottom within the holes 53 of the photosensitive resin 52, and in such case, variety occurred in the protruded shapes of the respective electroconductive members, whereby there was the problem that electrical connecting members could not be prepared with good precision.

Further, if a base member 51 made of a metal having crystal grain boundary such as copper, etc. is attempted to be etched by chemical etching, etching occurs on the crystal grain boundary and/or the crystal face susceptible to ethcing, and unevenness by crystal grains remained on the surface of concavity 54 after etching. For this reason, as the result of formation of unevenness also on the surface of the bump 34b formed by plating in the concavity 54, the shapes and heights of the respective bumps 34b became ununform. Particularly, the influence by the crystal grain boundary is great when the bumps become finer and higher in density, whereby there was the problem that no uniform connection could be effected with electrical circuit parts on the bump 34b side.

Also, according to the preparation process of the prior art, during formation of the electroconductive member 34 by gold plating, initially nucleation of gold occurred in the base memberr 51, and the metal (copper) in the base member 51 is penetrated before the gold 55 covers the base member 51 exposed, whereby the gold 55 and the metal (copper) in the base member 51 were co-precipitated. The electroconductive member 34 thus formed has a co-precipitated layer remaining at the protruded portion on the base member side, and when bonded to the connecting portion of electrical circuit part, there was the problem that variety of bonding strength or defective bonding was occurred.

In the case where an amount corresponding to a plurality of sheets is prepared comprehensively on one sheet for enhancing production efficiency of the sheet-shaped electrical connecting member 31, and divided after completion, when the photosensitive resin 35 at the dividing position is attempted to be cut, a stress occurs in the vicinity of the cutting portion, whereby cracks, etc. are generated to bring about drop-off or defective connection of the eletroconductive member 34, thus involving the problem that it can be cut with difficulty.

The holding member 35 of the electrical connecting member 31 as described above generally employs a photosensitive resin such as polyimide resin, etc., and its thickness is usually about 2 μm to 1 mm. Accordingly, in conveying or handling of the electrical connecting member 31, if excessive force is applied on the holding member 35, there were the problems that damages such as breaking, etc. were broughy about, that the electrocondcutive member 34 was dropped off by the stress occurring in the holding member 35.

Further, in the course of preparation as described above, in the photosensitive resin 35 coated on the base member 51, the solvent component contained in the liquid resin during precure is scattered to cause shrinkage to occur, and also internal stress occurs because of the difference in thermal expansion ratio between the resin and the base member. For this reason, when the base member 51 supporting the photosensitive resin 35 is removed, only the photosensitive resin 35 must stand the internal stress, and if further external force is applied, cracks may be formed or breaking occurs, whereby there was a fear that drop-off of electroconductive member 34 might be brought about.

SUMMARY OF THE INVENTION

An object of the present invention is to solve the problems of the prepartion processes of electrical connecting members of the prior art as described above, and to provide a preparation process enabling mass production of electrical connecting members having uniform shapes and sizes of bumps with good yield and at low cost.

Another object of the present invention is to provide a plating method in which a matrix member is arranged in the side surface shape of a cylinder, and then electroplating is applied on the respective pores while rotating the matrix member, whereby the plating thicknesses and the plating shapes in the respective porses can be uniformized, and veriety of protruded heights and protruded amounts of the respective electroconductive members can be eliminated even when preparing electrical connecting members having fine electroconductive members and a process for preparing an electrical connecting member by use of this.

Still another object of the present invention is to provide a process for preparing an electrical connecting member which can control constantly the height and/or the protruded amount of the bump formed as protruded on the surface of the holding member based on the detected value obtained by measuring previously the relationship between the bath voltage for the plating treatment for formation of an electroconductive member and the height to be protruded and/or the protruded amount of the electroconductive member and detecting the plating bath voltage, and also a method for detecting completion of plating accompanied therewith.

Still another object of the present invention is to provide a process for preparing an electrical connecting member which can realize easily the desired protruded shape of an electroconductive member by carrying out plural times of etching by exchange of etchants for the substrate comprising a plurality of layers.

Still another object of the present invention is to provide a process for preparing an electrical connecting member which can obtained easily a holding member having a desired film thickness, and can improve the yield by concelling variety of the film thicknesses of the holding member and the electroconductive member, by coating a photosensitive resin to a film thickness set in view of reduction of the film thickness accompanied with curing, and yet applying the treatment of uniformizing its thickness over the whole region of the substrate.

Still another object of the present invention is to disclose adequate exposure conditions and developint conditions for a photosensitive resin and provide a process for preparing an electrical connecting member which can form holes with a desired shape on the photosensitive resin, and can prepare an electrical connecting member equipped with an electroconductive member having a desired shape with good precision.

Still another object of the present invention is to provide a process for preparing an electrical connecting member which can obtain stable characteristics by removing bubbles of hydrogen gas attached on the substrate surface exposed within the holes, uniformizing the concavity shape to be formed on the substrate and cancelling variety of bump shapes.

Still another object of the present invention is to provide a process for preparing an electrical connecting member which has enabled stabilization of characteristics, improvement of the yield by removing effectively the resinous residue within the holes, uniformizing the concavity shape to be formed on the substrate end cancelling variety of the bump shapes.

Still another object of the present invention is to provide a process for preparing an electrical connecting member which can prepare an electrical connecting member having stable characteristics by having the steps of removing the co-precipitated layer to solve the problems as described above.

Still another object of the present invention is to provide a process for preparing an electrical connecting member by use of a base member made of a metal having crystal grain boundary, wherein a plurality of concavities of uniform surface shapes and depths with little unevenness can be formed on the substrate to form a plurality of uniform bumps without variety in shpes and heights.

Still another object of the present invention is to provide a process for preparing an electrical connecting member which can be easily cut at predetermined dividing positions, easily conveyed and handled, can release the internal stress occurring in the holding member during preparation, and prevent deterioration, breaking of the holding member and drop-off of the electroconductive member.

BRIEF DESCRIPTION OF DRAWINGS

FIGS. 29A and 29B are use examples of an electrical connecting member of another example according to the present invention;

FIGS 30A and 30B are another use examples of an electrical connecting member of another example according to the present invention;

DESCRIPTION OF THE PREFERRED EMBODIMENTS

Examples suitable for mass production of electrical connecting members equipped with bumps of stable shapes, sizes whic is the object of the present invention at low cost are shown below.

EXAMPLE 1

FIG. 4 is a schematic sectional view showing the preparation steps of an example according to the present invention. First, a copper-foil 101 which is the base member was prepared (FIG. 4A), and on one surface of the copper foil 101 was coated a polyimide resin 102 which is the nega-type photosensitive resin. The film thickness t of the polyimide resin 102 was thicker than the desired film thickness T (e.g. 10 μm) of the holding member, and made the film thickness value $t_o$ calculated by the formula (1) shown below or higher. The change in film thickness before and after prebaking and curing is caused by scattering of the solvent contained in the liquid polyimide and the curing shrinkage of the polyimide itself, and therefore the film thickness t was made $t_o$ or higher also in view of the curing shrinkage of the polyimide itself.

$$t_o = T \times \sqrt[3]{\frac{100}{100 - X}} \quad (1)$$

wherein X: volume concentration (%) of the solvent contained in the polyimide resin.

Figure 1A:
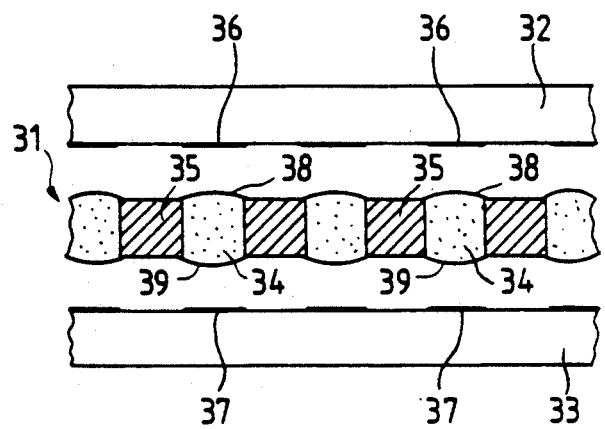
FIGS. 1A and 1B are schematic sectional views showing a use example of an electrical connecting member.
Figure 1B:
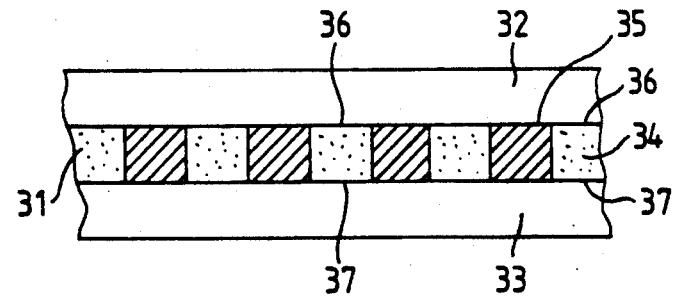
Figure 2A:
FIGS. 2A to 2F are schematic sectional views showing the steps of the preparation process of the electrical connecting member of the prior art.
Figure 2B:
Figure 2C:
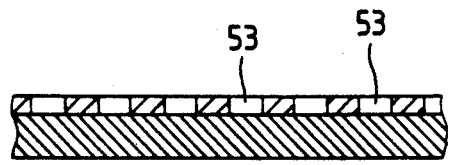
Figure 2D:
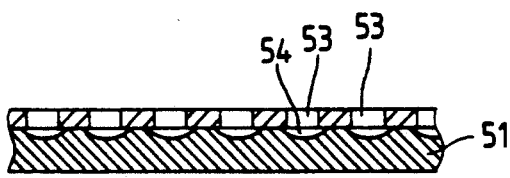
Figure 2E:
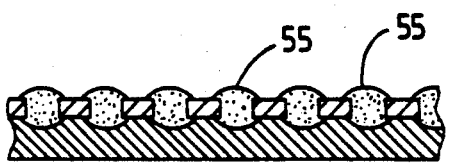
Figure 2F:
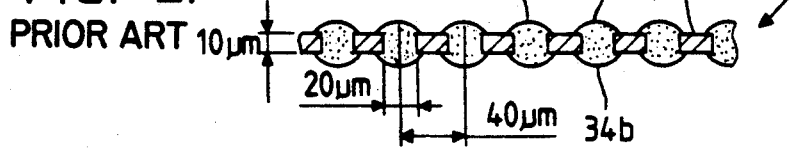
Figure 3A:
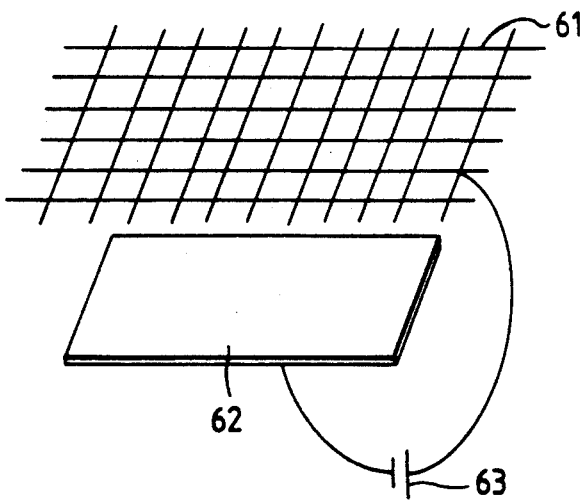
FIGS. 3A to 3C are schematic sectional views showing the electroplating method of the electroconductive member of the prior art.
Figure 3B:
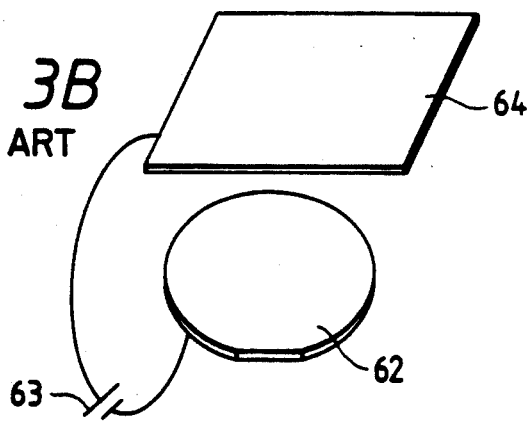
Figure 3C:
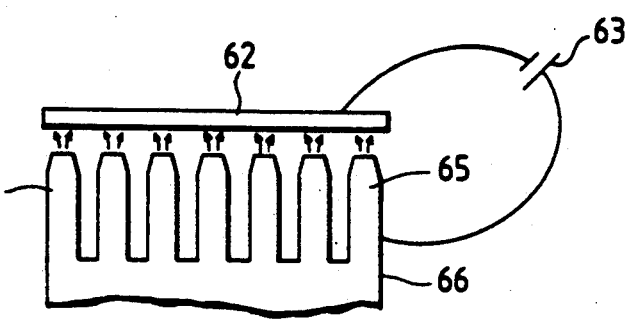
Figure 4A:
FIGS. 4A to 4H are schematic sectional views showing the steps of the preparation process according to an example of the present invention.
Figure 4B:
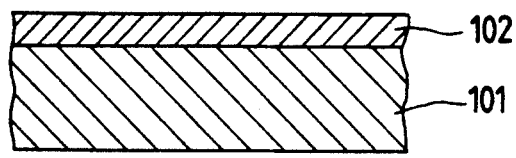
Figure 4C:
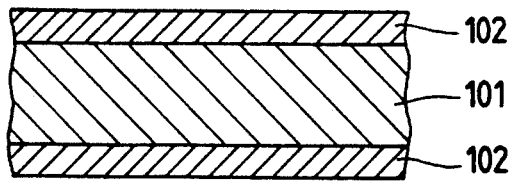

Next, the copper foil 101 coated with the polyimide resin 102 was placed horizontally, left to stand in $N_2$ or air over 30 minutes or longer to effect uniformization of the film thickness, followed by prebaking (FIG. 4B).

Figure 5:
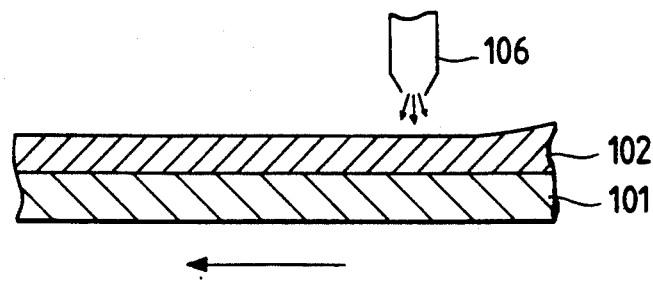
FIG. 5 is a schematic sectional view showing another example of the treatment step for uniformizing the film thickness of the coated polyimide resin.

FIG. 5 is a schematic secitonal view showing another example of the treatment step of uniformizing the film thickness of the polyimide resin 102 coated. In this example, compressed air was blown against the surface of the polyimide resin 102 after coating by use of a linear air knife 106 to effect uniformization of the film thickness.

Figure 6:
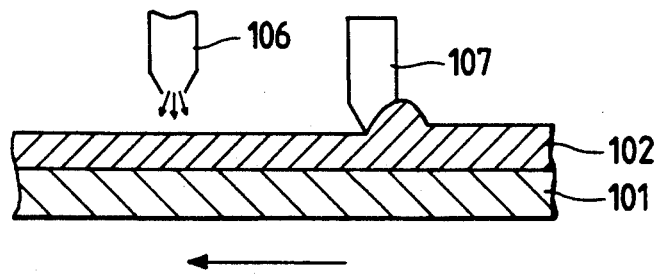
FIG. 6 is a schematic sectional view showing another example of the coating step and the film thickness uniformizing step of the polyimide resin.

FIG. 6 is a schematic sectional view showing another example of the coating step of the polyimide resin 102 and the uniformization step of its film thickness. In this example, the copper foil 101 was coated with the polyimide resin 102 by use of a squeeze 107, and compressed air was blown against the surface of the polyimide resin 102 after coating by use of the linear air knife 106 to effect. uniformization of the film thickness.

Figure 7A:
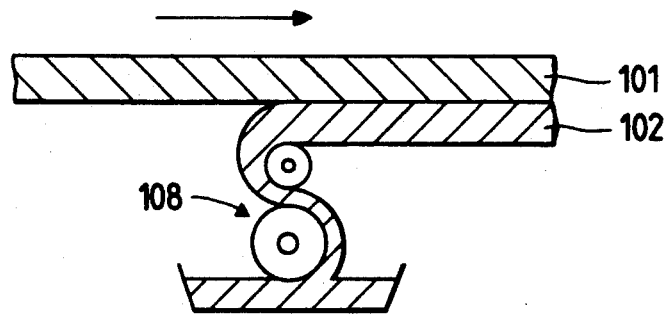
FIGS. 7A to 7B are schematic sectinonal views showing another example of the coating step and the film thickness uniformizing step of the polyimide resin.
Figure 7B:
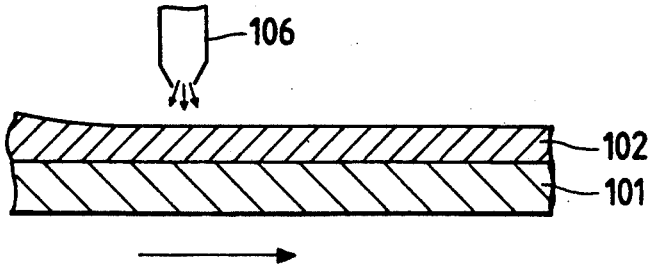

FIGS. 7A and 7B are schematic sectional views showing still another example of the coating step of the polyimide resin 102 and the uniformization step of its film thickness. In this example, the copper foil 101 is coated with the polyimide resin 102 by use of a roll coater 108 (FIG. 7A), and compressed air is blown against the surface of the polyimide resin 102 after coating by use of the linear air knife 106 to effect uniformization of the film thickness (FIG. 7B). During this operation, in the examples shown in FIG. 5 to FIG. 7, the film thickness coated is set in view of the reduction by curing as a matter of course.

Figure 4D:
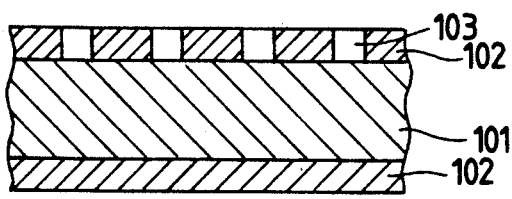
Figure 4E:
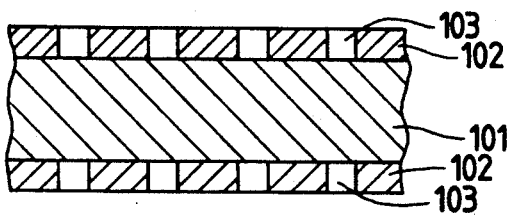

After formation of the polyimide resin with the desired thickness on the base member according to the examples as described above, a light was irradiated (exposed) through a photomask forming a predetermined pattern (not shown) on the polyimide resin 102, followed by developing. During this operation, the energy density of the light was set at 300 to 10,000 $mJ/cm^2$, and the developing time was made 4 to 30 minutes. In this example, at the irradiated portion, the polyimide resin 102 remained, while at the unirradiated portion, the polyimide resin 102 was removed by developing processing to form holes 103 with a diameter of about 20 μm (FIG. 4D). On the other hand, similar treatment was applied on the polyimide resin 102 to form a plurality of holes 103 (FIG. 4E). In this example, the holes 103 are formed on the surfaces one by one, but may be also formed on the both surfaces at the same time. Then, the temperature is raised up to 200° to 400° C. to cure the respective polyimide resins 102.

Figure 4F:
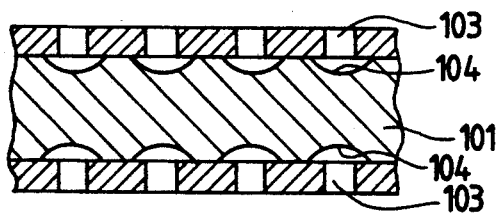

Next, the copper foil 101 applied with such treatment was etched by dipping in an etchant. By etching away a part of the copper foil 101 in the vicinity of the holes 103, concavities 104 communicated to the holes 103 were formed on the copper foil 101 (FIG. 4F). During operation, the diameter of the concavities 104 formed was made larger than the diameter of the holes 103 and smaller than half of the interperipheral distance of adjoining holes 103. By controlling thus the size of the concavities 104, an electrical connecting member without conduction mutually between adjoining electroconductive members and yet without drop-off of electroconductive member can be prepared. During this operation, the surface of the base member coated with no polyimide resin is required to be masked as practiced in the prior art. Accordingly, there was also no fear of generation of abnormal etching of the copper foil due to defective masking.

In the etching step of forming concavities on the base member surface, the copper foil 101 and the photosensitive resin 102 were dipped in the etchant to etch away a part of the copper foil 101 exposed within the holes 103 in an atomsphere of 700 mm Hg or lower to form the concavities 104 on the copper foil 101.

Figure 8:
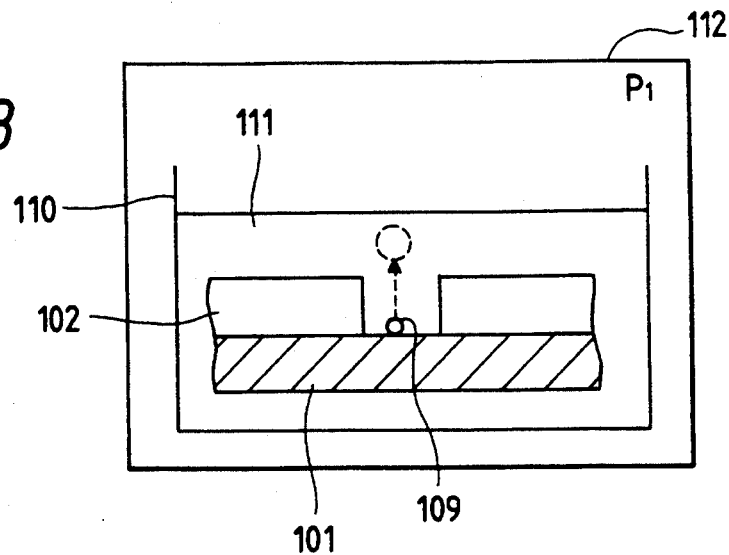
FIG. 8 is a schematic sectional view showing an example of the etching step in the example of the present invention.

FIG. 8 is a schematic view showing the embodiment during etching and, for example, the copper foil 101 was sunk in the etchant in the tank 110 housing the etchant 111 therein, the tank 110 was arranged within an air-tight chamber 112 and etching was practiced by reducing the pressure within the air-tight chamber 112 to 700 mm Hg or lower ($P_1 \leq 700$ mm Hg). The bubbles 109 of hydrogen gas generated by this were expanded to be literated from the surface of the copper-foil 101 and elevated toward the etchant surface. Accordingly, after elevation of the bubbles, the etchant flowed in, and also by elevation of the bubbles, the etchant was stirred, whereby exchange of the etchant within the holes 103 could be promoted to prevent residence.

The pressure of atmosphere was made 700 mm Hg or lower, because under an atmosphere exceeding this, expansion, separation of hydrogen gas bubbles were not sufficient.

Further, by vibrating mechanically the substrate during etching, liberation of the gas was further progressed. As the mechanical vibration system, the implement holding the base member may be moved, or alternatively a sonication vibrator may be placed at the bottom of the vessel for the etchant and both the substrate and the etchant may be vibrated.

Figure 9A:
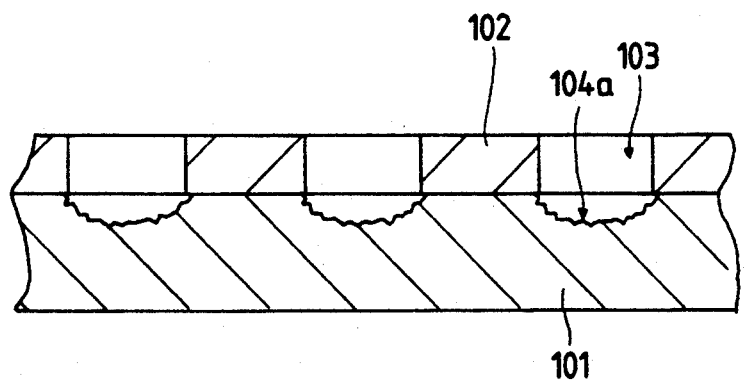
FIGS. 9A and 9 B are schematic sectional views showing another example of the etching step in the example of the present invention.

Next, the base member 101 exposed was chemically etched by use of a general etchant as described above to form concavities 104a communicated to the pores 103 on the base member 101 (FIG. 9A). For example, when the concavities 104a are formed to a depth of 4 to 5 μm, the etching time is about 5 to 20 seconds, and in such chemical etching, etching proceeded from the crystal grain boundary and/or the crystal face such as the (111) crystal face with little activation, etc. of the copper used for the base member 101, whereby unevenness due to crystal grains (1–30 μm, in the case of copper) remained on the surface of the concavities 104a. Due to such unevenness, the respective concavities 104a were found to be ununiform in shape and depth.

Figure 9B:
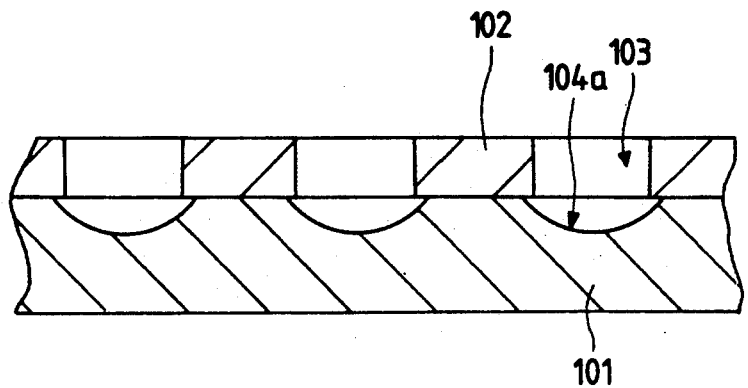

Next, with the base member 101 completed of such chemical etching as the anode, electrolytic etching was practiced with a Cu foil opposed as the cathode. Here, as the electrolyte, $2N-H_2SO_4$, or HCl, $NaOH+NH_4Cl$, etc. can be used. For example, when $2H-H_2SO_4$ was used for the electrolyte and a voltage of 0.33 V applied between the both electrodes, electrolytic etching for 1 to 10 minutes resulted in progress of etching from the convex portion of unevenness on the surface of the concavities 104a to polish the unevenness, thereby forming concavities 104b having smooth surface shape after completion of etching (FIG. 9B). During the chemical etching of the previous step, the impurities of organic materials contained in the etchant were attached on the concavities 104a to further worsen the unevenness on the concavity surface, but such impurities could be removed by performing electrolysis.

Figure 10A:
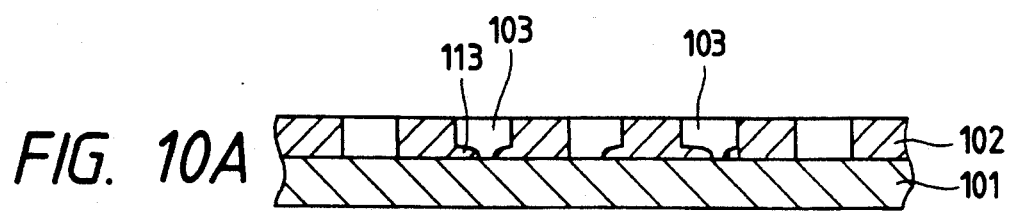
FIGS. 10A to 10D are schematic views showing another example of the etching step in the example of the present invention.

Also, as shown in FIG. 10A, there is the case where the residue 113 remains within the holes 103. An example capable of removing effectively such residue 113 is shown below.

Figure 10B:
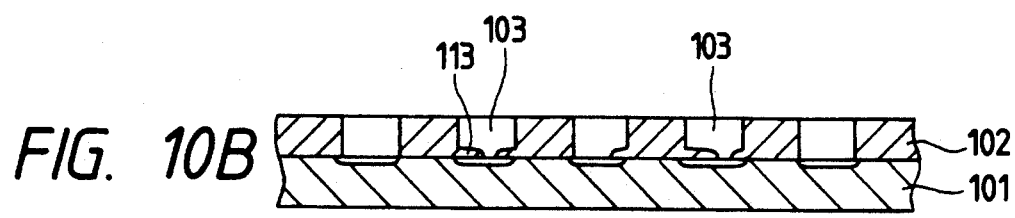

By dipping the copper foil 101 in an etchant with higher etching rate for copper than for the polyimide resin 102, the surface of the copper foil 101 coated with a residue to the extent with the contact area between the residue 113 and the copper foil 101 being reduced was lightly etched (FIG. 10B).

Figure 10C:
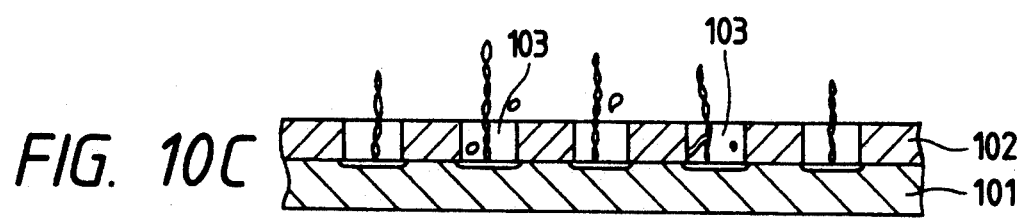

Next, the copper foil 101, the polyimide resin 102 were dipped in a liquid which has no etching function for these, or markedly slow etching rate for these although endowed with etching function, for example a liquid such as water, alcohol, etc., and vibration was given to the copper foil 101, the polyimide resin 102 and/or the liquid (FIG. 10C).

Alternatively, the copper foil 101 might be dipped in an etchant which has etching function only for the resinous residue, or is extremely great in etching rate for the polyimide resin as compared with for the base member, thereby etching away the resinous residue (FIG. 10C). By doing so, the contact area between the residue 113 and the copper foil 101 will be reduced. During such etching process, ultra-sonic wave (20 KHz–10 MHz) might be also propagated through the copper foil 101 of the etchant itself.

Such vibration was given by mechanical means, or alternatively by propagation of ultra-sonic wave through these. By doing so, the residue 113 existing within the holes 103 was separated by vibration of the liquid and removed from within the holes 103. Vibration could be desirably effected in every case by way of vibration with a plurality of frequencies, such as multifrequency vibration around 26K, 36K, 1M in removing the residue.

The conditions of the liquid such as temperature, concentration, composition, etc. during this operation may be set as desired.

Figure 10D:
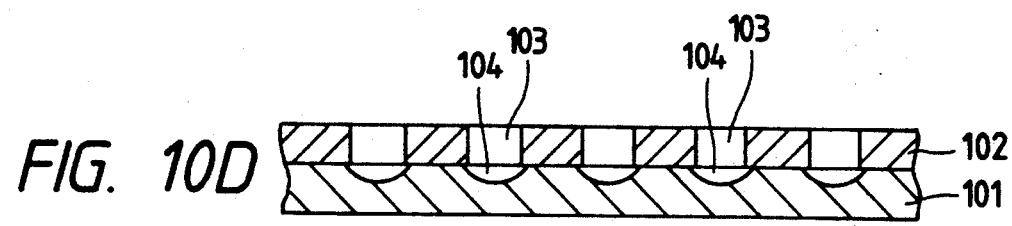

By such treatment, uniform concavities as shown in FIG. 10D could be formed on the substrate surface.

Figure 11A:
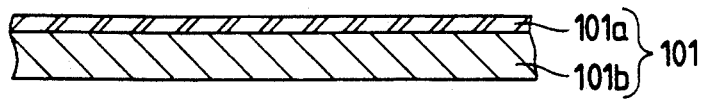
FIGS. 11A to 11F are schematic sectional views showing a part of the steps of another example of the present invention.

Further, a base member 101 comprising a laminate of a CuNi alloy layer 101a which is the first layer and a Cu layer 101b which is the second layer may be sometimes employed (FIG. 11A).

Figure 11B:
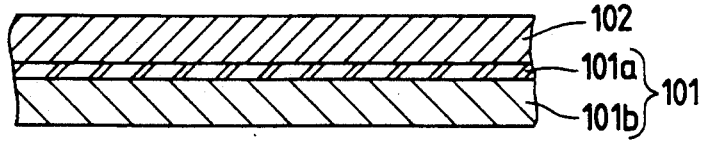
Figure 11C:
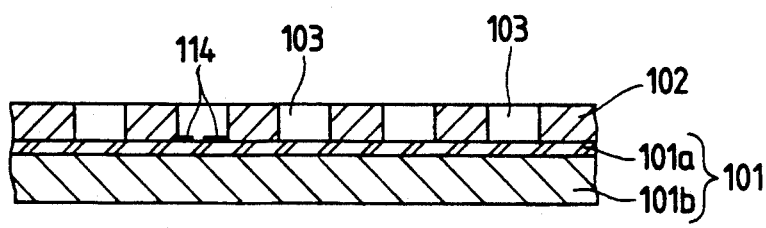

Also in this case, a holding member was provided on the base member according to the same steps as in the example as described above (FIG. 11B), and holes were formed through the holding member by exposure, developing through a photomask with a predetermined pattern, followed by curing of the polyimide resin which is the holding member (FIG. 11C).

Figure 11D:
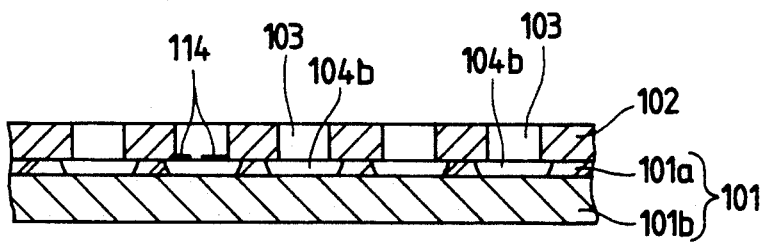
Figure 11E:
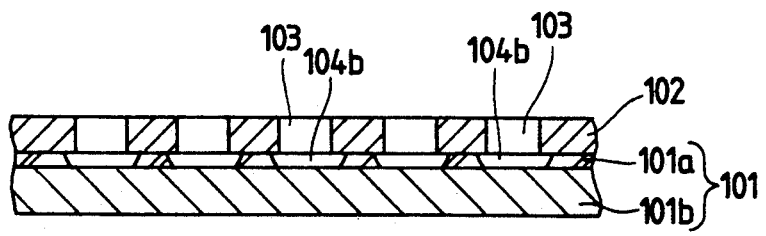
Figure 11F:
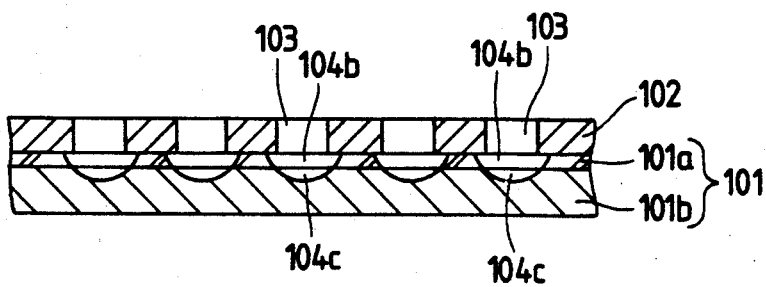

Next, the base member 101 thus treated was subjected to etching by dipping in a KSCN solution which was the first etchant. The ratio of the etching rate of the CuNi alloy layer 101a to that of the Cu layer 101b for the KSCN solution is about 10:1. Accordingly, during this etching step, substantially no etching onto the Cu layer 101b (the second layer), but a part of the CuNi alloy layer 101a near the holes 103 was etched away to form the concavities 104b communicated to the holes 103 on the CuNi alloy layer 101a (FIG. 11D). Next, foreign matters 114 were removed by application of ultra-sonic wave in 100 g/liter of NaOH (FIG. 11E). During this operation, since the CuNi alloy layer 101a (first layer) has been partially etched away, both surfaces of foreign matters 114 are opened from the CuNi alloy layer 101a, and the removal treatment of the foreign matters could be done easily. As different from such removal of foreign matters by chemical treatment, the foreign matters 114 might be also removed by physical treatment such as vibration of the substrate 101, etc. Next, a part of the Cu layer 101b was etched away with an acid which was the second etchant to form concavities 104c communicated to the concavities 104b in the Cu layer 101b (FIG. 11F).

In this example, in the electrical connecting member 31 prepared, the electroconductive member 34 is gold, and the holding member 35 is a polyimide resin.

In this example, as described above, etching in the first step for the substrate was carried out by use of an etchant (KSCN solution) which is extremely rapid in etching rate for the CuNi alloy than that of Cu, and then etching in the second step carried out by use of another etchant (acid). As the result, etching amount could be controlled individually for the first layer (CuNi alloy layer 101a) and the second layer (Cu layer 101b), whereby the shapes of the concavities 104b, 104c could be simply controlled. Accordingly, the protruded shapes of the respective electroconductive members 134 in the electrical connecting members 131 could be easily controlled.

Also, since the foreign matters 114 such as residue, etc. remaining on the base member 101 were removed, the shapes of the respective concavities 104b, 104c could be uniformized over the entire region of the base member 101. As the result, the protruded shapes of the respective electroconductive members 134 in the electrical connecting members 131 could be uniformized.

Figure 12:
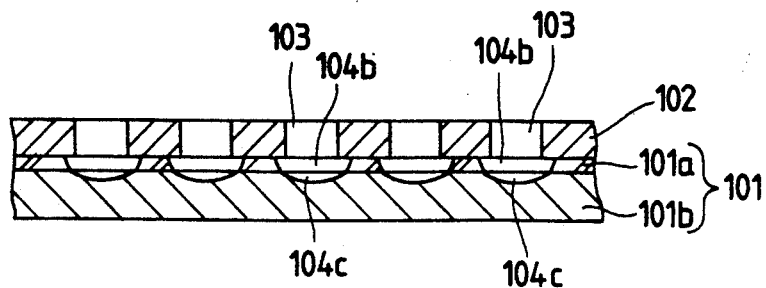
FIG. 12 is a schematic sectional view showing the etching step of another example of the present invention.

FIG. 12 is a schematic sectional view showing the state after etching away the second layer in another example of the preparation process of the present invention. If the Cu layer 101b which was the second layer was not etched away too much, the protruded shapes of the electroconductive members 134 depended on the shape of the concavities 104b formed on the CuNi alloy layer 101a which was the first layer. Accordingly, by controlling the film thickness of the CuNi alloy layer 101a, the protruded height of the electroconductive member 134 could be easily controlled. Other preparation steps are the same as in the examples as describe above.

Figure 4G:
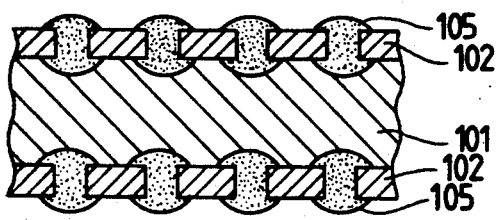

Next, by gold plating by use of the copper foil 101 which is the base member as the common electrode, gold 105 was filled into the holes 103, the concavities 104, and gold plating was continued until the gold 105 was protruded from the surfaces of the respective polyimide resins 102 (FIG. 4G). During this operation, the surface of the base member coating with no polyimide resin was required to be masked as practiced in the art. Accordingly, there was no fear of abnormal growth of gold 105 (electroconductive member) due to change in current density accompanied with penetration of gold etchant, and also there was no abnormal precipitation of the gold 105 onto the copper foil 101.

Figure 13:
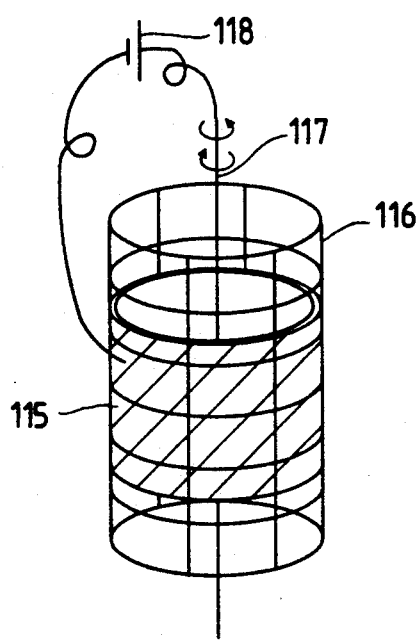
FIG. 13 is a schematic sectional view showing an example of the electroplating step in the example of the present invention.

Next, the gold plating step is described. FIG. 13 is a perspective view showing the state of practice of the plating method. In the Figure, 116 is a mesh support with the frame being shaped in a cylinder. Inside of the mesh support 116 was mounted the matrix member 115 completed of the step in FIG. 4F. The mesh support 116 was joined to a driving mechanism (not shown) so as to be rotatable with its axis center as the center. The matrix member 115 mounted on the mesh support 116 was rotated integrally with the mesh support 116. At the axis center position of the mesh support 116 was provided a bar-shaped counter electrode 117. The counter electrode 117 connected to the anode of the direct current source 118, and the copper foil 101 of the matrix member 115 to the cathode of the direct current source 118. Etchant and etchant tank are omitted in the Figure.

Next, the procedure of gold plating to fill the electroconductive member 105 into the insulating layer 102 is described. By use of a constant current source, one shown in FIG. 4F was connected as the material to be foild to the cathode, and plating with the gold sulfite bath connected with, for example, Pt foil as the anode was carried out while detecting the bath voltage during plating.

Figure 14:
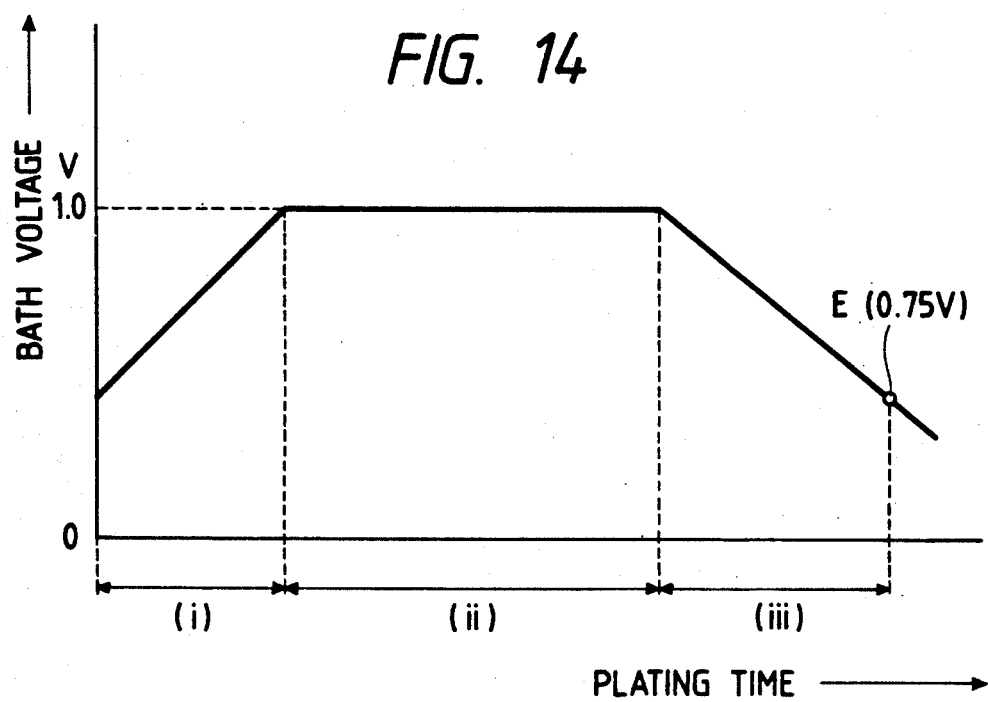
FIG. 14 is a graph showing the relationship between bath voltage and plating time in the electroplating step in the example of the present invention.

FIG. 14 is a graph showing an example of the relationship between bath voltage and plating time. When plating was initiated, gold was precipitated to form, first, the bumps 105b at one end of the electroconductive members 105 within the concavities 104 of the base member 101. This formation period corresponded to (i) in FIG. 12, and since the plating area within the concavities 104 was reduced with the progress of plating, the bath voltage was increased.

When bumps are formed within the concavities 104, then plating progressed into the pores 103 of the holding member 102 to form columnar portions 105c which are portions of the electroconductive members 105 to be embedded within the holding member. This formation period corresponded to (ii) in FIG. 12, and since the cross-sectional area was constant within the pores 103, a constant equilibrium potential was detected for the bath voltage.

When the columnar portions 105c of the electroconductive members 105 were formed after completion of filling of plating within the pores 103, and next plating progressed onto the surface of the insulating layer 102. Then, plating was spread over the surface of the insulating layer 102 around the pores 103, whereby the bath voltage was reduced. This period corresponded to (iii) in FIG. 12, and plating was completed at the point when the bath voltage became the voltage E previously determined by the actually measured data, etc. For example, when the area of the columnar portion 105c is 10 cm$^2$, the equilibrium voltage was 1.0 V and the voltage E 0.75 V. By this, the bumps 105a of the other end are formed on the surface of the insulating layer 102 to complete the electroconductive members 105 (FIG. 4G). By determining previously the bath voltage E at which plating is to be completed, in spite of surface area change of the concavities 104 formed on the base member 101, The surface area of teh humps 105a formed on the surface of the insulating layer 102 became constant every time of plating stpes, and also the height h could be made substantially constant.

Next, actuation of the gold plating apparatus is described. First, as shown in FIG. 13, the matrix member 115 was mounted on the mesh support 116. Then, the mesh support 116 was rotated with the axis center as the center, and gold plating was applied on the pores and the concavities of the matrix member 115 until gold was protruded from the surface of the polyimide resin. Since the side opposed to the counter electrode 117 becomes the foild surface, the foil surface of the matrix memeber in this example is the innerside surface. In this example, since electroplating is applied while rotating the matrix member 115 to be foild, the plating liquid flow can be easily made laminar flow and aslo the flow rate and direction of the plating liquid can be changed freely, whereby plating thickness and plating shape in the respective plural pores and the cancavities communicated thereto could be made uniform. As the result, in the electrical connecting members prepared, the protruded heights and the protruded amounts of the respective leectroconductive members could be made uniform. The rotational direction of the mesh support 116 (matrix member 115) may be in the constant direction throughout the gold plating step, or may be also changed alternately in the rotational direction at predetermined cycles. Rather than the case in which the rotational direction is fixed in one direction, the shapes of the respective electroconductive members can be made more uniform by changing alternately the rotational direction.

Next, another example of gold plating step is described.

Figure 15:
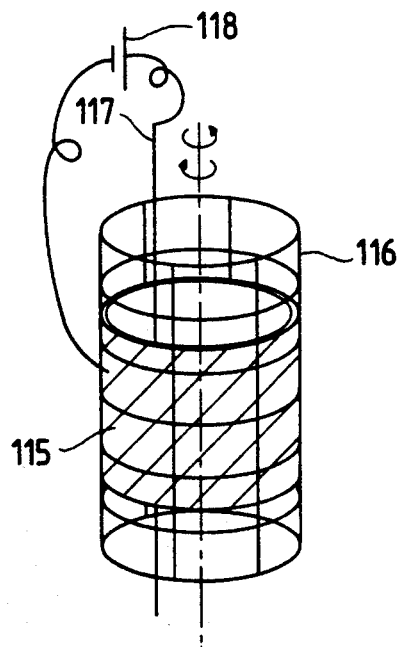
FIG. 15 is a schematic sectinal view showing another example of the electroplating step in the example of the present invention.

FIG. 15 is a perspective view showing the state of practice of another example. In this example, a bar-shaped counter electrode 117 was provided eccentrically from the axis center position of the mesh support 116 (rotational center axis of the matrix 115). Other constitutions are the same as in the example shown in FIG. 13. Also in this example, gold plating could be applied on the matrix member 115 similarly as in the example shown in FIG. 13 to exhibit similar effects.

Figure 16:
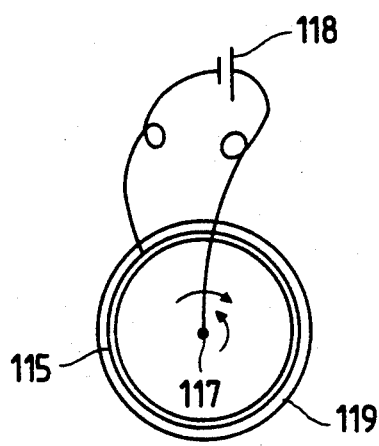
FIG. 16 is a schematic sectional view showing another example of the electroplating step of the example of the present invention.

FIG. 16 is a top view showing the state of practice of another example. In the figure, 115 is the matrix member after completion of the step in FIG. 4F, and the matrix member 115 was mounted on the inner surface of the cylindrical support 119 forming a cylindrical shape. The cylindrical support 119 is joined to a driving mechanism (not shown), and was rotated integrally with the matrix member 115 with its axis center as the center. Also at the axis center position was provided a bar-shaped counter electrode 117, and the copper foil 101 of the matrix member 115 and the counter-electrode 117 were connected to the direct current power source 118. Also in this example, gold plating could be applied on the matrix member 115 similarly as in the example shown in FIG. 13 to exhibit similar effects. The counter electrode 117 is not required to be provided at the axis center position of the cylindrical support 119, but may be eccentric.

Figure 17:
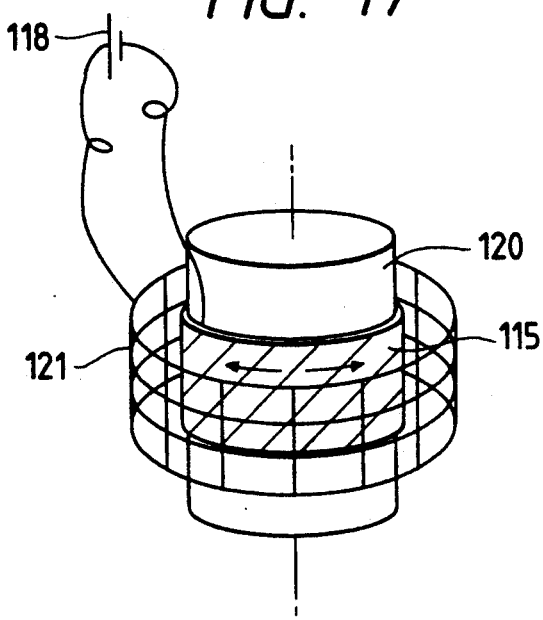
FIG. 17 is a schematic sectional view showing another example of the electroplating step in the example of the present invention.

FIG. 17 is a perspective view showing the state of practice of another example. In the figure, 115 is the matrix member after completion of the step in FIG. 4F, and the matrix member 115 was mounted on the side surface of the columnar support 120 forming a columnar shape. The columner support 120 is joined to a driving mechansim (not shown), and was rotated integrally with the matrix member 115 with its axis center as the center. Outside of the matrix member 115 was provided the mesh electrode 121 with a frame forming a cylindrical shape as a counter electrode at an adequate distance apart from the matrix member 115. The mesh electrode 121 was connected to the anode of the driect current power source 118, and the matrix member 115 to the cathode of the direct current power source 118, respectively. Since the side opposed to the mesh electrode 121 which is the counter-electrode becomes the foild surface, the foild surface of the matrix member 115 was the outside surface in this example. Also in this example, gold plating could be applied on the matrix member 115 similarly as in the example shown in FIG. 13 to exhibit similar effects. The counter electrode was not required to be a mesh electrode as shown, but a cylindrical counter electrode might be employed. The support might be cylindrical, and gold plating could be done if the matrix member 115 was mounted on the outside surface of the cylindrical support.

In the examples of the four gold plating steps as described above, direct current power source was employed, but pulse power source may be also available. Connection between the copper foil 101 or the matrix member 115 and the cathode of the direct current power source 118 may be done according to any method, provided that current can flow therebetween. The mesh support 116, the cylindrical support 119 and the columnar support 120 may be either electroconductive or non-electroconductive materials. When electrically connected, the supports 116, 119 and 120 are also applied with gold plating, and therefore they can be made partially non-electroconductive.

Figure 4H:
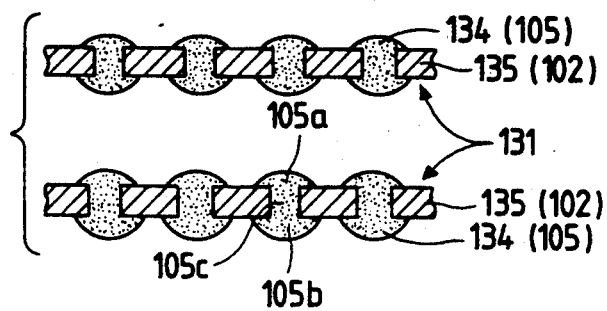

Finally, the copper foil 101 which is the base member was removed by metal etching by use of an etchant which etched copper but did not gold and the polyimide resin to prepare the two electrical connecting members 131 at the same time (FIG. 4H). During this operation, because there was no abnormal precipitation of the gold 105 onto the copper foil 101, the copper foil 101 could be removed easily. In this example, in the electrical connecting member 131 prepared, the electroconductive member 134 was the gold 105, and the holding member 135 was made the polyimide resin 102. Here, if the thickness of the copper foil 101 was made thick (about 1 to 2 mm), penetration of the etchant from the end surface portion of the copper foil was possible. Also, if the thickness of the copper foil 101 was made thick, influences of warping, undulation became smaller, whereby exposure irregularity during exposure, developing could be reduced, and also the conveying implement could be easily designed.

Figure 18:
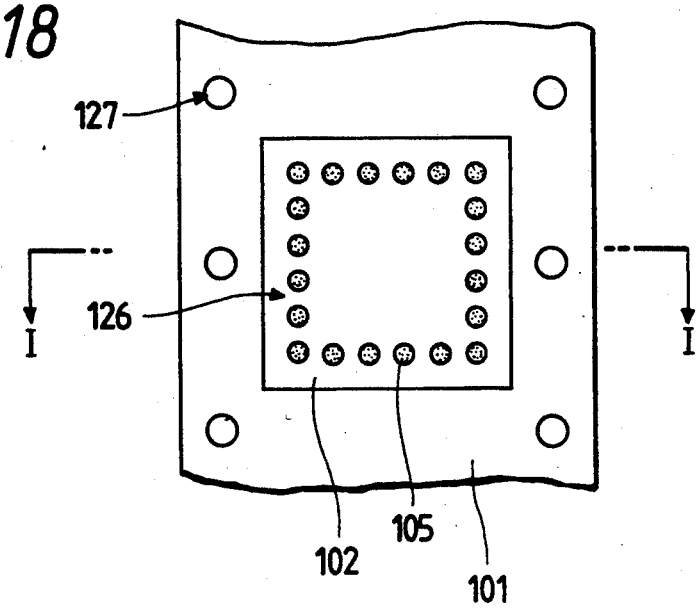
FIG. 18 is a plan view of an electrical connecting member in the example of the present invention.
Figure 19A:
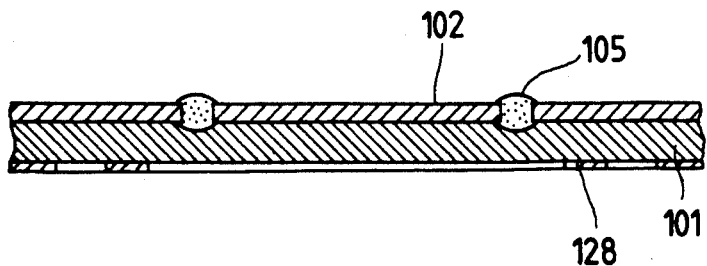
FIGS. 19A and 19B are schematic sectional views showing a part of preparation steps at the cross-section taken along the line I—I in FIG. 18.
Figure 19B:
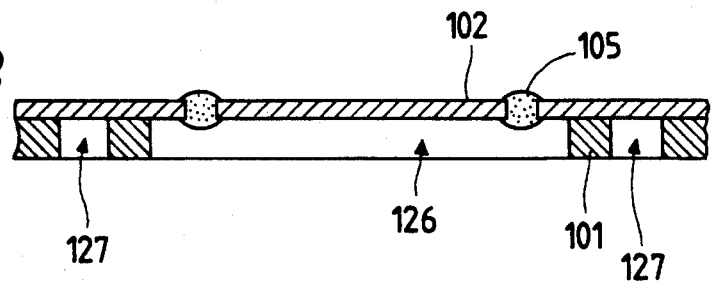

FIG. 18 is a plan view showing an example of electrical connecting member, and FIG. 19B a sectional view taken along the line I—I therein. FIG. 18 is a view as seen from the lower side of FIG. 19B. The central portion is constituted of a laminated state of the sheet-shaped holding member 102 and the base member which is a base layer equipped with holes 126 constituted of the holding member and the electroconductive member. In the holding member 102, at the portions exposed form the holes 126 of the base member 101, a plurality of electroconductive members 105 were provided under juxtaposed state so as to form a rectangular form with the both ends of these being exposed on both surfaces of the holding member 102. Shortly speaking, the holding member 102 was constituted to form a laminated state with the base member 101 at the surrounding portions except for the region equipped with the electroconductive members 105. Also, on the base member 101 are formed a plurality of circular holes 127 under juxteposed state in an array on both sides of the holes 126, and also at internal of these holes 127, a part of the holding member 102 was exposed on the base member 101 side.

In the thus constituted electrical connecting member, connection with electrical circuit parts was done by use of electroconductive members 105 equipped on the holding member 102 exposed from the holes 126 of the base member 101. In conveying or handling such electrical connecting member, the laminated portion of the surrounding base member 101 and the holding member 102 was devised to be grasped, whereby no superfluous force was applied on the portio of the holding member 102 equipped wit hthe electroconductive members 105 as in the prior art and no breaking of the holding member 102 and drop-off of the electroconductive members 105 was brought about. Further, by provision of the holes 127, the electrical connecting member could be surely gripped without being slipped off. It was also easy to form thru-holes in the holding member 102 corresponded to the holes 127, and also conveying and handling characteristics could be further enhanced.

The holes 127 is an example for improving conveying and handling characteristics, and it is also possible to have other suitable shapes other than the holes remain in the base member for accomplishing this object.

FIGS. 19A and 19B show schematic views of the preparation steps of the cross-section taken along the line I—I in FIG. 18.

Next, on the surface of the base member 101, a masking tape 128 was plastered at the portion previously determined which is the portion to be removed with the base member 101 being selectively remained in the subsequent step, namely regions other then the filling region of the electroconductive member 105 (FIG. 19A).

Finally, the base member 101 was etched away by use of an etchant which did not etch the insulating layer 102 and the electroconductiv member 105 to peel off the masking tape 128 (FIG. 19B). By doing so, the insulating layer 102 was constituted as the holding member 102 equipped iwth the electroconductive members 105. The base member 101 existing in the region of the holding member 102 equipped with the electroconductive member 105 was removed to form the holes 126, whereby the region of the holding member 102 equipped with the electroconductive members 105 were exposed. The surrounding portions around the holes 126 remained as constituted of the laminated state of the base member 101 and the holding member 102 with the masking tape 128, and the holes 127 were formed in the tape non-plastered region at that portion to complete preparation of the electrical connecting member.

Thus, the base member 101 is not completely removed, but the laminated portion of the base member 101 and the holding member 102 remains, and by use of the laminated portion as the means for conveying, no damage was given to the holding member 102 even when external excessive force was applied, and further the electroconductive member 105 was dropped off. On the other hand, when no external force was applied, the internal stress occurring in the insulating layer 102 due to the shrinkage accompanied with curing of the photosensitive polyimide resin used for the insulating layer 102, or the difference in thermal expansion ratio between the polyimide resin and the copper foil used for the base member 101 was relaxed.

Figure 20:
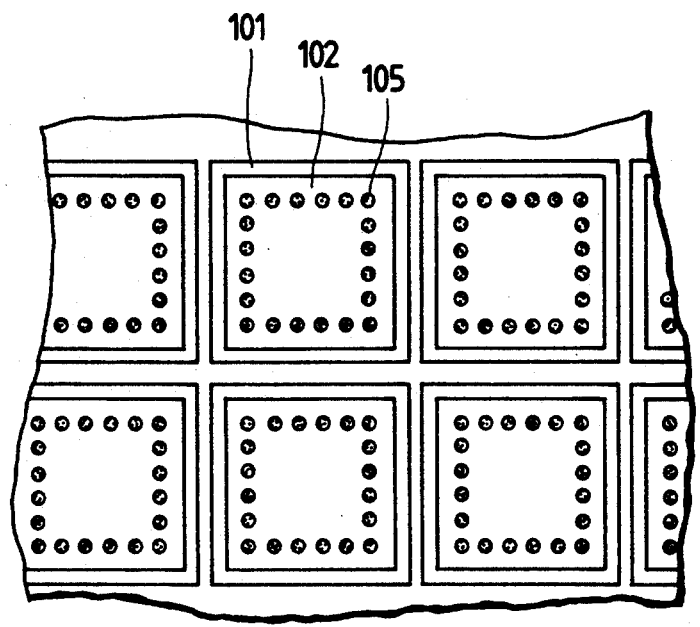
FIG. 20 is a plan view of an electrical connecting member in another example of the present invention.

FIG. 20 is a plan view showing another example of electrical connecting member, which is one constituted of a plurality of units formed into a mass as one sheet of holding member 102 when the electrical connecting member shown in FIG. 18 is made one unit, and the base members 101 were respectively in a cyclic shape around the regions of the holding members 102 forming the respective units equipped with the electroconductive members 105.

With such constitution, no excessive force was applied on the holding member 102 within each unit during conveying and handling, whereby breaking and drop-off of the electroconductive members 105 were not brought about. Also, in the course of preparation, the internal force occurring in the holding member 102 when the base member 101 was all removed in the prior art was relaxed by the remaining base member 101 to give similar effects.

Figure 21:
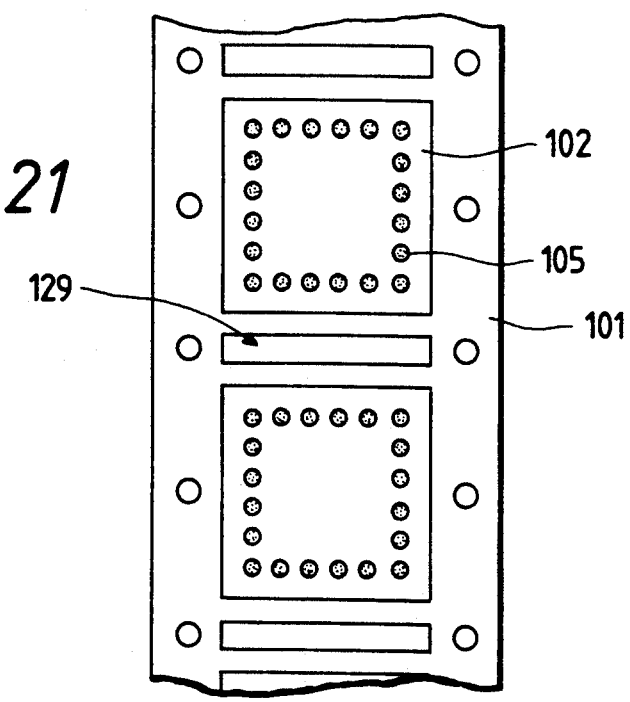
FIG. 21 is a plan view of an electrical connecting member in another example of the present invention.

FIG. 21 is a plan view showing another example of electrical connecting member which is a mass of electrical connecting members of a plurality of units similarly as in the example shown in FIG. 20, and it has further holes 129 shaped in slit at the central portion with the base member 101 remained between the units when the portion of the holding member 102 equipped with the electroconductive member 105 is made one unit.

When constituted in this way, the internal stress occurring in the holding member 102 between the respective holding member 102 can be relaxed by the holes 129.

In the three examples as described above, the constitution is made such that the portion where the base member remains is the whole surrounding of the region of the holding member equipped with the electroconductive members, but this is not limitative, but may be left partially.

The constitution is made to plaster a masking tape in order to leave the base member to remain, but in place thereof, a resist, etc. may be also employed, and a suitable means or forming the region which is not subjected to etching may be employed.

The masking of the masking tape, etc. need not be removed but may be also left to remain as such.

Figure 22:
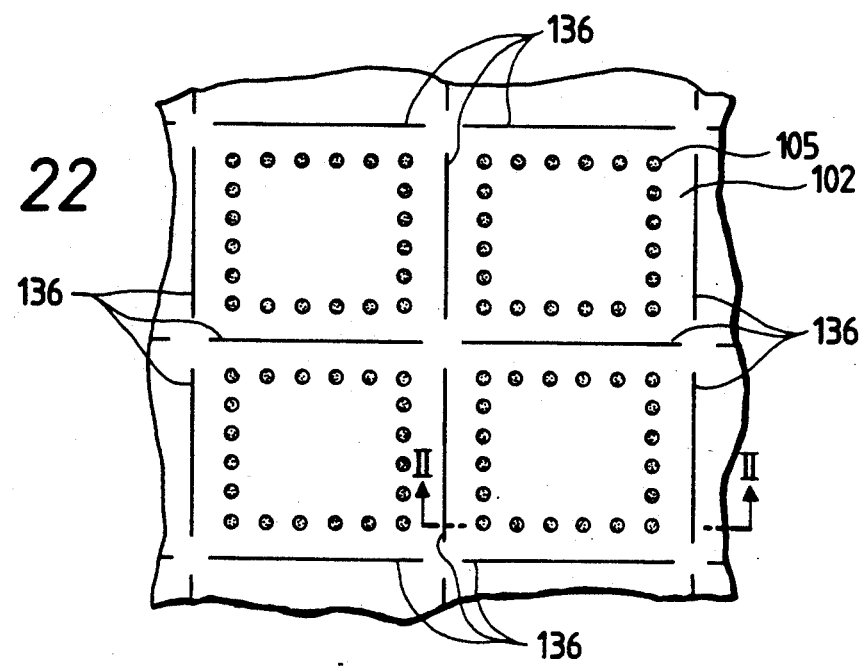
FIG. 22 is a plan view of an electrical connecting member in another example of the present invention.

Further, FIG. 22 is a plan view showing another example of the electrical connecting member. The sheet-shaped holding member 102 is provided with a plurality of electroconductive members 105 under the state so that the both ends of these were exposed on the both surfaces of the holding member 102 to form a plurality of rectangular forms, and cuttings 136, which were respectively continuous linearly mutually between the electroconductive members forming the respective rectangular forms. Shortly speaking, a plurality of cuttings 136 were formed on the holding member 102 so as to surround in rectangular shape larger by-one round around the portion where the group of electroconductive members forming one rectangular form, and the ends of the respective cuttings 136 were made not continuous to the ends of other cuttings 136. The cuttings 136 may be formed to go through the holding member 102, or may be stopped at an appropriate depth.

In the electrical connecting member thus constituted, a plurality of cuttings 136 corresponding to predetermined dividing positions were selected and the cuttings 136 when they were not formed through the holding member 102 were cut so that they were formed therethrough and also their ends became continuous to each other. By doing so, the electrical connecting member could be divided easily into necessary sizes without formation of cracks, etc. on the holding member 102. Cutting for such division could be done at any time before connection, during connection or after connection of electrical circuit parts.

In this example, one cutting 136 is constituted as provided continuously, but in place thereof, it may be also provided intermittently in perforation, and also it is not limited to straight line but may be provided in shape of a curved line.

Figure 23:
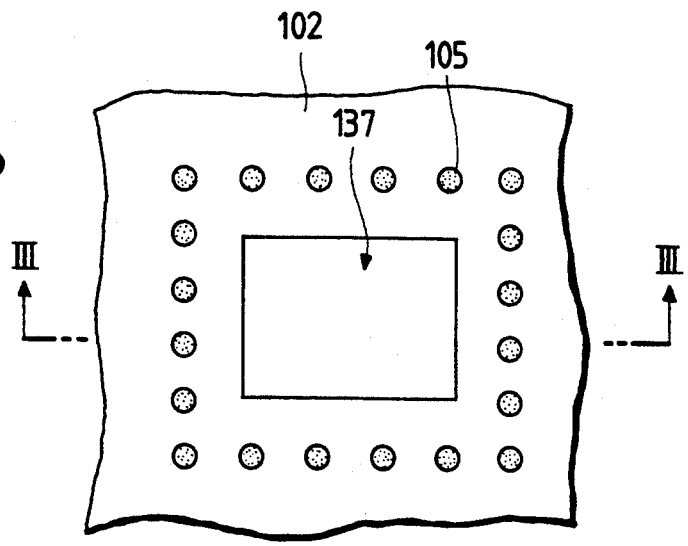
FIG. 23 is a plan view of an electrical connecting member in another example of the present invention.

FIG. 23 is a plan view showing another example of the electrical connecting member. The holding member 102 is similarly provided with a plurality of electroconductive members 105 under the state juxtaposed in rectangular shape, and rectangular holes 137 are formed through the holding member 102 at the portion where surrounded by the electroconductive members 105 thus provided.

In the electrical connecting member thus constituted, the holes 137 were employed for relaxing the internal stress occurring in the holding member 102. As the result, no breaking and drop-off of the electroconductive members 105 was brought about by application of excessive force to the holding member 102 as in the prior art.

Figure 24A:
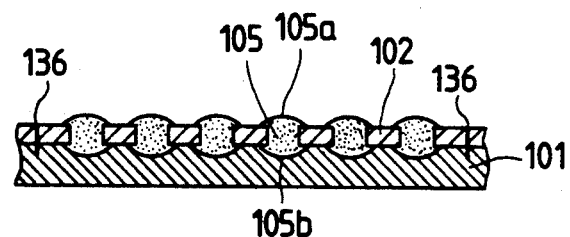
FIGS. 24A and 24B are schematic sectional views taken along the line II—II in FIG. 22.
Figure 24B:
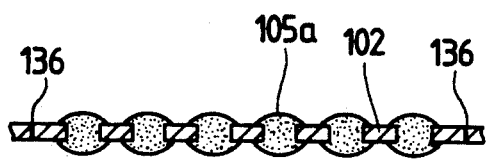
Figure 24C:
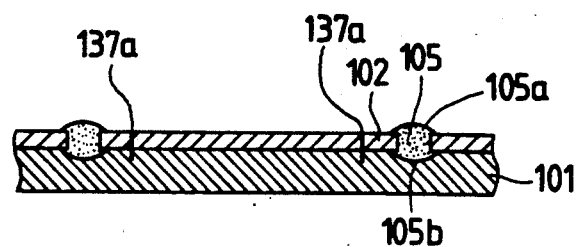
FIGS. 24C and 24D are schematic sectional views taken along the line III—III in FIG. 23F
Figure 24D:
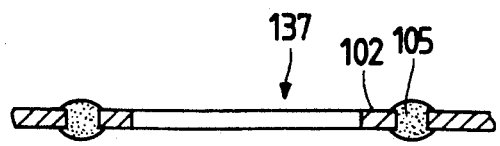

Here, FIGS. 24A and 24B show sectional views taken along the line II—II in FIG. 22, and FIGS. 24C and 24D schematic sectional views taken along the line III—III in FIG. 23.

In the electrical connecting member of the example shown in FIG. 22, cuttings 136 were formed on both outsides of the electroconductive members 105 at the both ends (FIG. 24A), while in the electrical connecting member of the example shown in FIG. 23, cuttings 137a which became the peripheral of the holes 137 were formed on both insides of the electroconductive members 105 at the both ends (FIG. 24C). Here, the respective cuttings 136 and 137a were formed from the surface of the insulating layer 102 to the depth reaching the base member 101, and the cuttings 137a were formed continuously in rectangular loop shape. For these formation methods, there may be employed any suitable method such as the formation method by means of a suitable cutting tool with mechanical application of a certain force, the formation method by use of a laser beam, the method by photolithography, etc. The depth of the cutting 136 should be desirably made at least ½ or more of the thickness of the insulating layer 102 in order to relax the internal stress occurring in the insulating layer 102 and permit later cutting to be done easily, and as described above, workability could be improved when formation was effected through the insulation layer 102 until stopped at the depth reaching the base member 101 than the case when forming cuttings even through the base member 101.

By formation of these cuttings 136 and 137a, the internal stress occurring in the insulating layer 102 due to shrinkage accompanied with curing of the photosensitive polyimide resin used for the insulating layer 102 or the difference in thermal expansion ratio between the polyimide resin and the copper foil used for the base member 101 was relaxed.

Finally, the base member 101 was etched away by use of an etchant which did not etch insulating layer 102 and the electroconductive members 105. By this, the electrical connecting member of the example shown in FIG. 22 was completed in FIG. 24B and became dividable at the cuttings 136. In FIG. 24D, by removing the insulating layer 102 surrounded by the cuttings 137a together with the base member 101, holes 137 were formed to complete preparation of the electrical connecting member of the example shown in FIG. 23.

Figure 25:
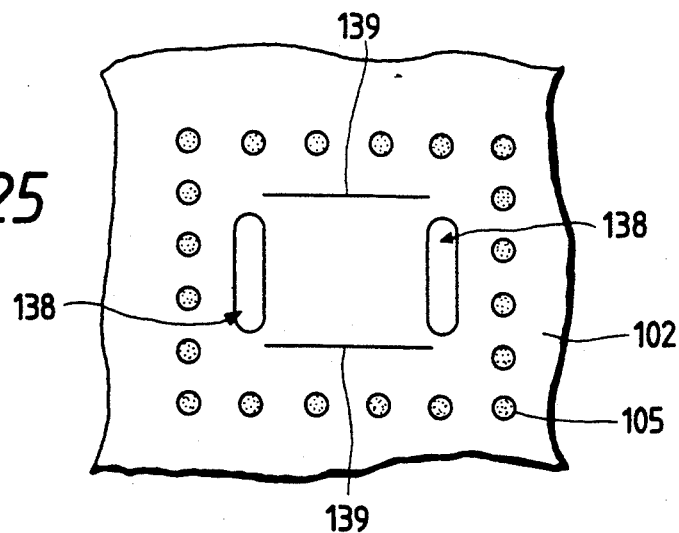
FIG. 25 is a plan view of an electrical connecting member in another example of the present invention.

FIG. 25 is a plan view showing another example of the electrical connecting member, which is an example in which the cuttings and the holes as described above are combined. The holding member 102 is provided similarly with a plurality of electroconductive member 105 under the state juxtaposed in rectangular shape, and each two of ellipsoidal holes 138 and linear continuous cuttings 139 are provided at the portion surrounded by the electroconductive members 105 thus provided. The cuttings 139 were not formed through the insulating layers 102 but to the depth of ½ of the thickness.

In the electrical connecting member thus constituted, in the course of preparation thereof, the internal stress occurring in the insulating layer 102 was relaxed by the cuttings 139 and the cuttings for formation of the holes 138, and after completion, the holes 138 were employed as the holes for conveying and handling. Shortly speaking, the cuttings 139 are in this case formed for stress relaxation during preparation.

As described above, the cuttings can relax the stress acting on the holding member during preparation, can be cutting positions for dividing the electrical connecting member after completion, and can form the holes for conveying and handling by removing the portions surrounded by the cuttings. The positions and depths of the cuttings, the sizes and the shapes of the holes, etc. may be set at any desired shape, position and depth corresponding to the dividing position or the conveying mode, etc.

Figure 26:
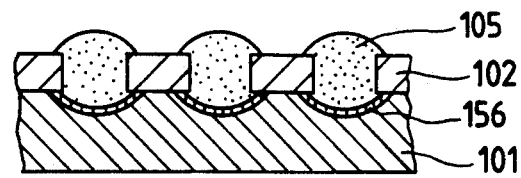
FIG. 26 is a schematic sectional view showing the co-precipitated layer of an electroconductive member.

Then, the copper foil 101 which is the base member was removed by metal etching with the use of an etchant which etched copper but did not etch gold and the polyimide resin. During this operation, when the co-precipitated layer 156 of copper and gold has a certain thickness or higher, the co-precipitated layer 156 could not be removed (FIG. 26). Accordingly, finally, a part (thickness less than 1 μ m) of the gold 105 protruded from the polyimide resin 102 was etched to remove the co-precipitated layer 156 to prepare an electrical connecting member 131. Here, by packing the protruded portion on the side where no co-precipitated layer 156 existed so as to prevent penetration of the etchant, only the co-precipitated layer 156 could be removed without cutting unnecessarily this portion.

In the examples as described above, the diameter of the electroconductive member 105 at the portions exposed from the both surfaces of the holding member was larger than that of the portion embedded internally of the holding member, but this is not necessarily limitative of the invention.

Figure 27:
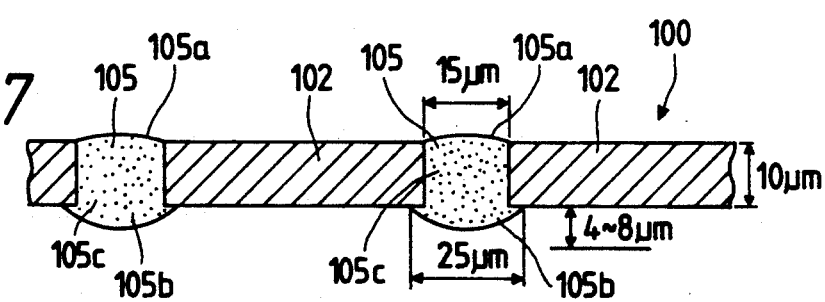
FIG. 27 is a schematic sectional view of another example according to the present invention.

For example, in the electroconductive member shown in FIG. 27, one end 105b of the electroconductive member 105 exposed has its diameter (about 25 μ m) larger than the diameter of the portion embedded in the holding member about 15 μm), thus forming so called outwardly expanded shape (protruded height, about 4 to 8 μm). On the other hand, the other end 105a of the electroconductive member 105 exposed is slightly exposed from the holding member 102 and its diameter is approximately equal to the diameter of the portion embedded in the holding member 102.

Such electroconductive member 105 was obtained by performing electroplating of gold with the copper foil 101 as the common electrode, and completing gold plating when gold is slightly exposed from the upper surface of the polyimide resin 102 in the step of filling gold into the holes 103 and the concavities 104.

Figure 28:
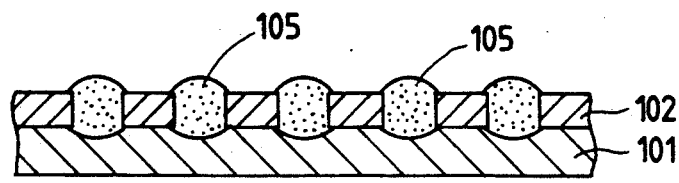
FIG. 28 is a schematic sectional view of another example according to the present invention.

The electroconductive member with the shape as shown in FIG. 28 was obtained by shortening the etching time in the step of etching the copper foil 101 to form concavities on its surface. It is only required that only one end of the electroconductive member 105 may be substantially protruded, and concavities need not be necessarily formed.

Next, a use example of an electrical connecting member equipped with such electroconductive members is described.

FIG. 29 is a sectional view showing a first use example, showing an example of transfer, formation of metal bumps onto the electrodes of IC chip. In the Figure, 171 is an IC chip with an electrode pattern 172 comprising Al being formed on the surface, and on the surface of the IC chip where no electrode 172 is formed, there is formed a passivation film 180. First, after registration of the electroconductive members 105 (ends 105b) of the electrical connecting member 100 as shown in FIG. 27 on the electrodes 172 on such IC chip 171, the bonding implement 178 is moved in the blank arrowhead direction, and the electroconductive members 105 which are metal bumps were transferred, bonded onto the electrodes 172 by the thermal pressure adhesion method (FIG. 29A). The metal bumps 105 (Au) transferred and the electrodes 172 (Al) were metal bonded to effect strong bonding. Next, only the holding meber 102 was mechanically peeled off to form only the metal bumps 105 on the electrodes 172 (FIG. 29B). Here since the diameter of the end 105a of the electroconductive member 105 on the side not in contact with the electrode 172 was approximately the same as the diameter of the portion in the holding member 102, removal only of the holding member 102 was easily done. As different from mechanical peeling (peel-off), the holding member 102 may be removed by chemical dissolving treatment.

FIG. 30 is a sectional view showing a second use example, showing an example of transfer, formation of metal bumps onto the film lead of a film carrier. After registration of the electroconductive members 105 (ends 105b) of the electrical connecting member 100 and the film lead 176 of a film carrier on the stage 179 made of ceramics, the bonding implement 178 was moved in the blank arrowhead direction, and the electroconductive members 105 which are metal bumps were transferred, bonded onto the film lead 176 (FIG. 30A). Next, by mechanical peeling or chemical dissolution, only the holding member 102 was removed to form only the metal bumps (electroconductive members) 105 on the film lead 176 (FIG. 30B).

Other than the two use examples as described above, the electrical connecting member of the present invention could be also employed for formation of metal bumps on the connecting portion of the inner lead or on the connecting portion of the outer lead of an IC package in which the inner lead and the outer lead were separated or formation of metal bumps on the connecting portion of the conductor pattern on a print wiring base member.

Having described in this example about the case of the both ends 105a, 105b of the electroconductive member 105 exposed from the holding member 102, this is not limitative, but the metal bumps can be formed on the connecting portion of the conductor according to the same procedure as described even in an electrical connecting member having the other end 105a embedded in the holding member 102.

In the following, other Examples 2 to 7 are shown, in which the practice contents in the respective steps in Example 1 as described above are applied as such.

EXAMPLE 2

FIG. 31 is a schematic sectional view showing the preparation steps of another example according to the present invention. First, a copper foil 201 which is a base member was prepared (FIG. 31A), and on one surface of the copper foil 201, the photosensitive polyimide resin 202 was coated in the same manner as in Example 1, followed by pre-baking (FIG. 31B). After irradiation (exposure) of a light through a photomask (not shown) forming a predetermined pattern on the polyimide resin 202, developing was carried out to form a plurality of holes 203 in the polyimide resin 202 (FIG. 31C). Next, on the other surface of the copper foil 201 where no polyimide resin 202 was coated, the polyimide resin 202 was coated according to the same method, followed by pre-baking (FIG. 31D). On the polyimide resin 202 newly coated, the same exposure, developing processing were applied to a plurality of holes 203 also in the polyimide resin 202 (FIG. 31E). Then, the temperature was elevated to cure the polyimide resin.

Figure 31A:
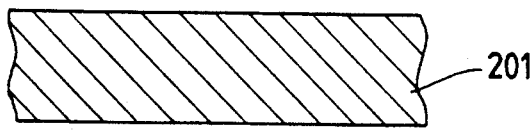
FIGS. 31A to 31H are schematic sectional views showing the steps of the preparation process of another example according to the present invention.
Figure 31B:
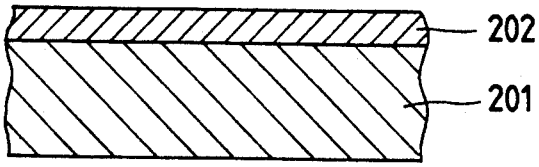
Figure 31C:
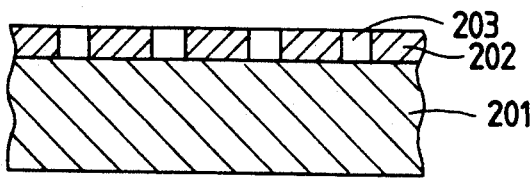
Figure 31D:
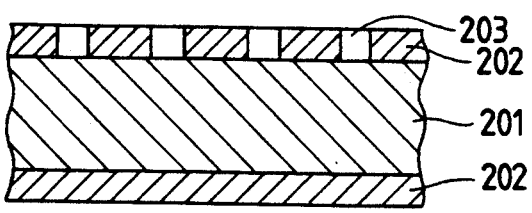
Figure 31E:
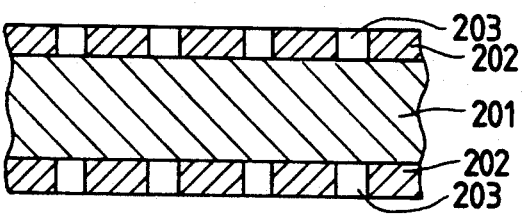
Figure 31F:
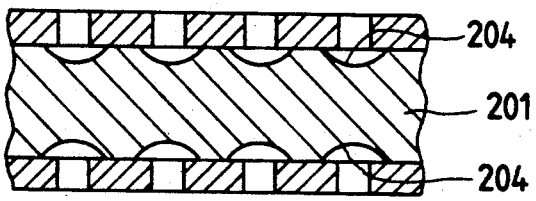
Figure 31G:
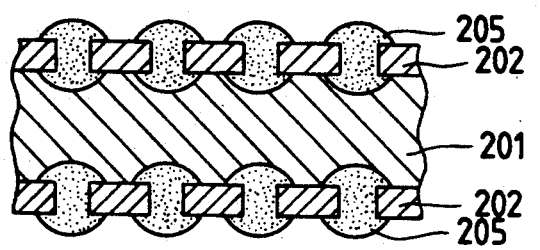
Figure 31H:
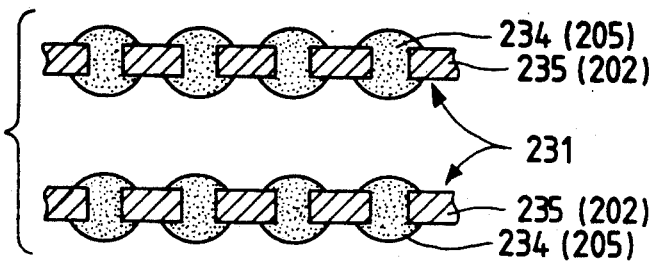

In entirely the same manner as described in Example 1, a part of the copper foil 201 near the holes 203 was etched away to form concavities 204 (FIG. 31F), and gold 205 was filled into the holes 203 and the concavities 204 by gold plating (FIG. 31G), and then the remaining copper foil 201 was removed by etching to prepare electrical connecting members 231 (FIG. 31H).

Also in this example, similarly as in Example 1, electrical connective members were prepared at the same time on the both surfaces of the copper foil 201, and therefore there was the effect that mass production was possible at once similarly as in Example 1. Also, for penetration of the etchant in the etching removal step of the copper foil, the same effect as in Example 1 was obtained.

EXAMPLE 3

FIG. 32 is a schematic sectional view showing the preparation steps of another example according to the present invention. First, a copper foil 301 which is the base member was prepared (FIG. 32A), and on one surface of the copper foil 301, the photosensitive polyimide resin 302 was coated, followed by pre-baking (FIG. 32B). After irradiation (exposure) of a light through a photomask (not shown) forming a predetermined pattern on the polyimide resin 302, developing was carried out to form a plurality of holes 303 in the polyimide resin 302 (FIG. 32C). Then, the temperature was elevated to cure the polyimide resin 302.

Figure 32A:
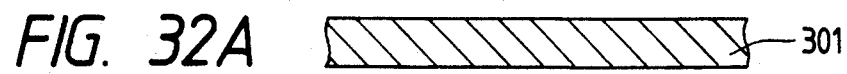
FIGS 32A to 32G are schematic sectional views showing the steps of the preparation process of another example according to the present invention.
Figure 32B:
Figure 32C:
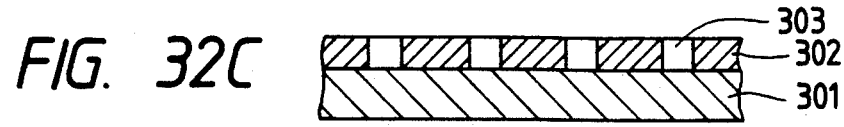
Figure 32D:
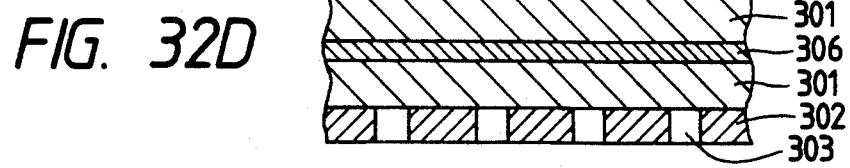
Figure 32E:
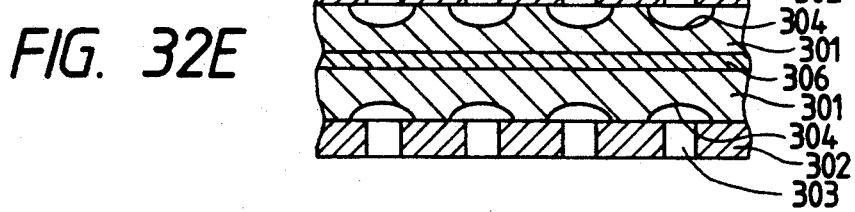
Figure 32F:
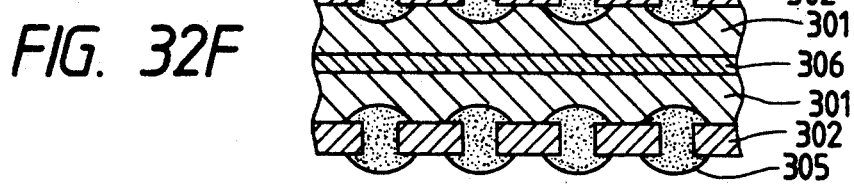

The two sheets of copper foils 301 as shown in FIG. 32C thus prepared were plastered with an adhesive 306 with contact mutually between the surfaces where no polyimide resin 302 was provided (FIG. 32D). Next, the copper foils 301 were etched to form concavities 304 communicated to the holes 303 (FIG. 32E). During this operation, the surface of the copper foils where no polyimide was coated was not required to be masked as in the prior art. Therefore, there was also no generation of abnormal etching of copper foil due to defective etching.

Figure 32G:
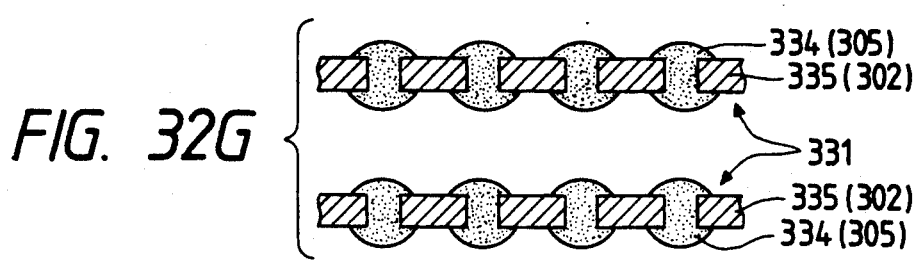

Then, by gold plating, gold 305 was filled into the holes 303 and the concavities 304 until the gold 305 was protruded from the surfaces of the respective polyimide resins 302 (FIG. 32G). Also during this operation, the surface of the copper foil where no polyimide resin was coated was required to be masked. Therefore, there was neither abnormal growth of the gold 305 (electroconductive member) due to change in current density accompanied with penetration of the gold plating liquid nor abnormal precipitation of the gold 305 onto the copper foil 301.

Finally, the copper foils 301 and the adhesive 306 were removed by etching to prepare electrical conductive members 331 (FIG. 32G). During this operation, since there was no abnormal precipitation of the gold 305 onto the copper foil 301, the copper foils 301 could be removed easily. For penetration of the etchant, the same effect as described above in Example 1 was obtained.

EXAMPLE 4

FIG. 33 is a schematic sectional view showing the preparation steps of another example according to the present invention. First, a copper foil 401 which is the base member was prepared (FIG. 33A), and on one surface of the copper foil 401, the photosensitive polyimide resin 402 was coated in the same manner as in Example 3 and pre-baked (FIG. 33B), followed by exposure, developing processing to form a plurality of holes 403 in the polyimide resin 402 (FIG. 33C). Next, the temperature was elevated to cure the polyimide resin 402, followed by partial etching of the copper-foil 401 to form the concavities 404 communicated to the holes 403 (FIG. 33D).

Figure 33A:
FIGS. 33A to 33G are schematic sectional views showing the steps of the preparation process of another example according to the present invention.
Figure 33B:
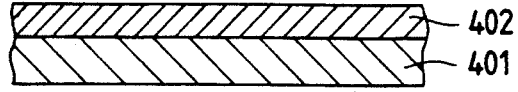
Figure 33C:
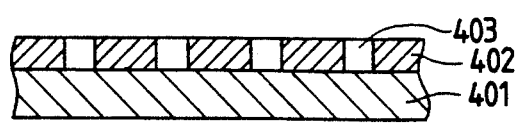
Figure 33D:
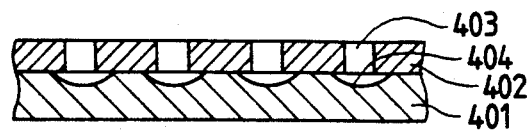
Figure 33E:
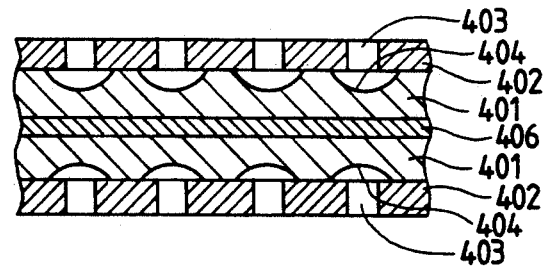
Figure 33F:
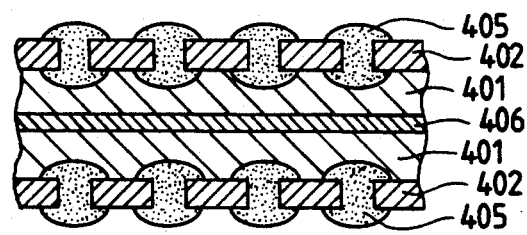
Figure 33G:
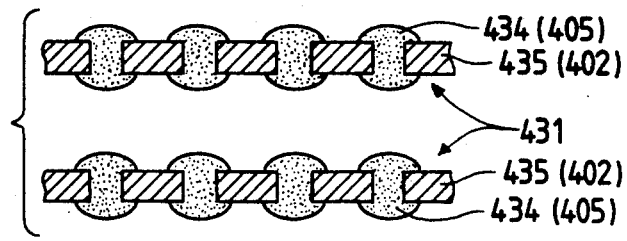

The two sheets of the copper foils 401 as shown in FIG. 33D thus prepared were plastered with an adhesive 406 with contact of the surfaces on the side where no polyimide resin 402 was formed (FIG. 33E). In this Example, as different from Example 3, the two sheets of copper foils 401 were adhered after formation of the concavities 404. Therefore, even with an electrical connecting member different in protruded amounts of the electroconductive members, concavities with desired shape could be formed for the respective copper foils, whereby it became possible to flow the same gold plating liquid and improvement of tact time could be effected to great extent. Then, similarly as in Example 3, gold 405 was filled into the holes 403 and the concavities 404 by gold plating (FIG. 33F), and finally the copper foils 401 and the adhesive 406 were etched away to prepare electrical connecting members 431 (FIG. 33G).

Also in this example, masking for the copper foil became unnecessary in the gold plating step, and the problems in the prior art could be cancelled. As for penetration of the etchant in the etching removal step of copper foil, the same effect as in Example 1 was obtained.

EXAMPLE 5

FIG. 34 is a schematic sectional view showing the preparation steps of another example according to the present invention. First, a matrix member 520 comprising polyimide resins 512 which are insulating layers provided on both surfaces of a copper foil 511 which is the base member was prepared (FIG. 34A). In this example, since holes were obtained in the polyimide resin by irradiation of a high energy beam, the polyimide resin used was not required to be a photosensitive resin. The preparation method of the matrix member 520 may be either by way of forming the copper foil 511 on one of the polyimide resin 512 by vapor deposition, plating or both thereof, followed by coating of the other polyimide resin 512 on the copper foil 511, or by way of coating the both surfaces of the copper foil 511 with polyimide resins 512.

Figure 34A:
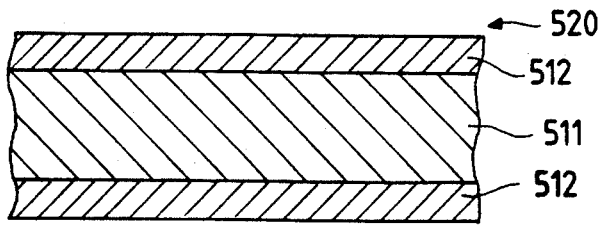
FIGS. 34A to 34F are schematic sectional views showing the steps of the preparation process of another example according to the present invention.
Figure 34B:
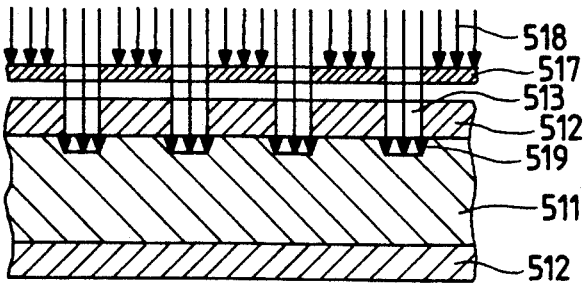
Figure 34C:
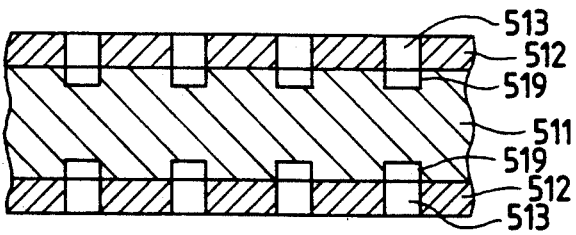

Next, with a posi-type mask 517 placed on one of the polyimide resins 512, an excimer laser beam 518 which is a high energy beam such as KrF, ArF, etc. was irradiated. The bondings of molecules of the polyimide resin 512 at the portion irradiated by the photoenergy of the excimer laser beam 518 were cleaved to form a plurality of holes 513. The polyimide resin 512 was then developed (etched) until the copper foil 511 was exposed, and further the excimer laser beam 518 was irradiated even after the copper foil 511 had been exposed to form holes 519 communicated to the holes 513 also in the copper foil 511 (FIG. 34B). At this time, by controlling the irradiated pulse number corresponding to the irradiation energy per one pulse and the etching rate of the copper foil 511, the depth of the holes 519 formed in the copper foil 511. The excimer laser beam 518 was also irradiated on the other polyimide resin 512 to form holes 513, 519 (FIG. 34C). In this example, the excimer laser was irradiated on the surfaces, one by one, but it may be also irradiated on the both surfaces at the same time.

Figure 34D:
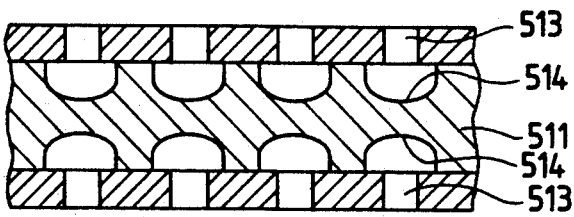

Next, the copper foil 511 subjected to such treatments was dipped in an etchant to etch away a part of the copper foil 511 near the holes 519 to form concavities 514 (FIG. 34D). During this operation, the diameter of the concavities 514 was made larger than the diameter of the holes 513 (holes 519) and smaller than half of interperipheral distance of adjoining holes 519. By doing so, the adjoining electroconductive members were not conducted to each other, and yet there was no drop-off of the electroconductive members. Since the holes 519 were formed by the excimer laser beam 518 before chemical etching with an etchant in the downward direction, the concavities 514 formed after etching became to have a shape expanded larger in the downward direction than the size expanded in the lateral direction. During this operation, similarly as in Example 1, it is not required to mask the surface of the polyimide resin not coated with the polyimide resin as in the prior art, and therefore there was also no generation of abnormal etching of the copper foil due to defective masking.

Figure 34E:
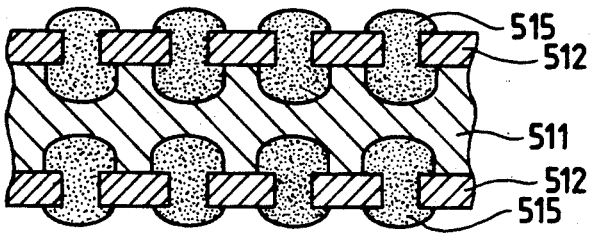

Then, by gold plating similarly as in Example 1, gold 515 was filled into the holes 513 and the concavities 514 (FIG. 34E). Also in this case, similarly as in Example 1, it is not required to mask the surface of he polyimide resin not coated with the polyimide resin as in the prior art, and there is neither abnormal growth of the gold 515 (electroconductive member) due to change in current density accompanied with penetration of the gold plating liquid nor abnormal precipitation of the gold 515 onto the copper foil 511.

Figure 34F:
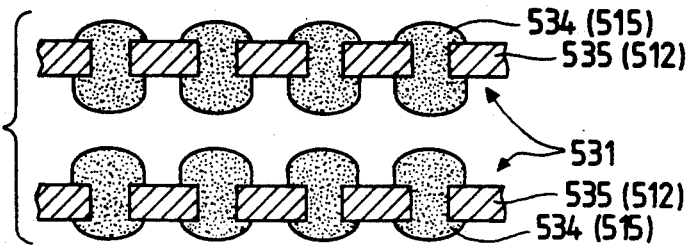

Finally, similarly as in Example 1, the remaining copper foil 511 was etched away to prepare two electrical connecting members 531 at the same time (FIG. 34F). Here, by making the thickness of the copper foil 511 thick (about 1-2 mm), the etchant could be penetrated from the end surface portion of the copper foil 511. Also, by making the thickness of the copper foil 511 thick, the influences from warping and undulation became less, whereby improvement of pattern precision and conveying implement design could be easily done. When the thickness of the copper foil 511 is not thick, the holes other than the holes in which the gold 515 (electroconductive member) is filled may be provided separately at unnecessary places during excimer laser beam irradiation and subjected to masking, and the masking peeled off during removal of the copper foil 515 and the etchant penetrated through this portion to etch away the copper foil 515.

EXAMPLE 6

FIG. 35 is a schematic sectional view showing the preparation steps of another example according to the present invention. First, a matrix member 621 having a polyimide resin 612 (not required to be photosensitive) which is the insulating layer provided on one surface of the copper foil 611 was prepared (FIG. 35A). The preparation method of the matrix member 621 may be either by way of forming the copper foil 611 by use of vapor deposition, plating or both of them in combination, or coating the polyimide resin 612 on one surface of the copper foil 611. Similarly as in Example 5, with a posi-type mask 617 placed on the polyimide resin 612, the excimer laser beam 618 which is a high energy beam was irradiated to form a plurality of holes 613 through the polyimide resin 612 and also the holes 619 communicated to the holes 613 in the copper foil 611 (FIG. 35B). During this operation, similarly as in Example 5, the depth of the holes 619 formed in the copper foil 611 was controlled by controlling the irradiated pulse number of the excimer laser beam 618.

Figure 35A:
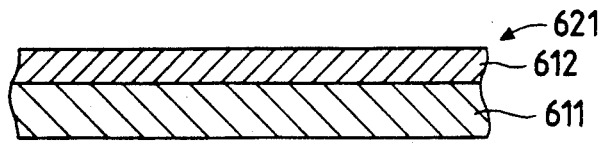
FIGS. 35A to 35F schematic sectional views showing the steps of the preparation process of another example according to the present invention.
Figure 35B:
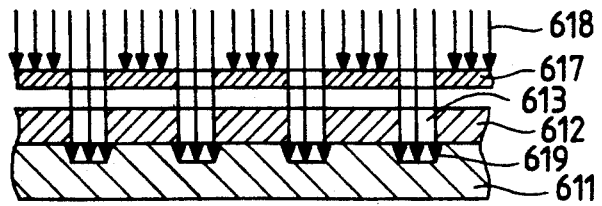
Figure 35C:
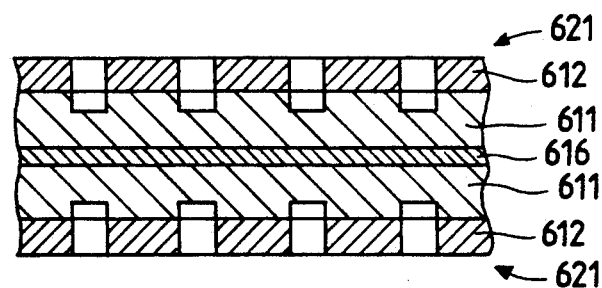
Figure 35D:
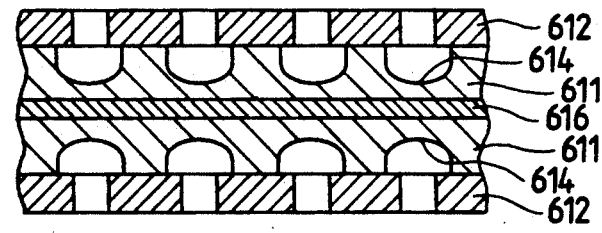
Figure 35E:
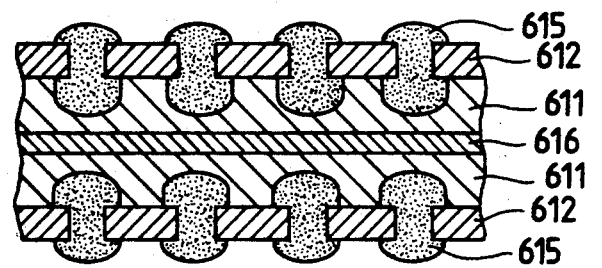
Figure 35F:
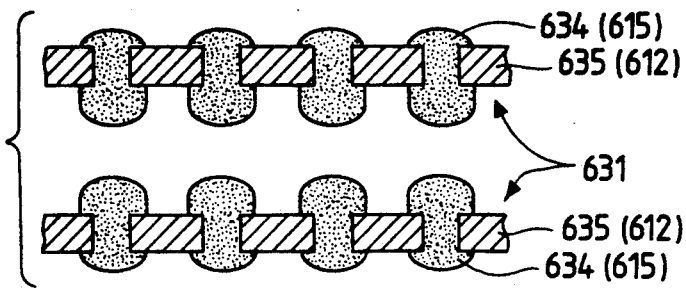

Next, the two sheets of matrices 621 thus prepared were plastered together with an adhesive 616 with contact between the surfaces where no polyimide resin 612 was provided (FIG. 35O). Next, similarly as in Example 5, the holes 619 were expanded by partial etching of the copper foils 611 with an etchant to form concavities 614 (FIG. 35D), gold 615 was filled into the holes 613 and the concavities 614 by gold plating (FIG. 35E), followed finally by etching away the remaining copper foils 611 and the adhesive 616 to prepare electrical connecting members 631 (FIG. 35F).

Also in Example 6, similarly as in Example 5, in the concavity formation step and the gold plating step, no masking of the surface of the copper foil where no polyimide resin was provided as required in the prior art was necessary, and entirely the same effect could be obtained. As for penetration of the etchant in the removal step of the copper foil, the same effect as in Example 5 could be obtained.

EXAMPLE 7

FIG. 36 is a schematic sectional view showing the preparation steps of another example according to the present invention. First, similarly as in Example 6, a matrix member 721 having a polyimide resin 712 which is the insulating layer provided on one surface of the copper foil 711 was prepared (FIG. 36A), and with a posi-type mask 717 placed on the polyimide resin 712, the excimer laser beam 718 which is a high energy beam was irradiated to form a plurality of holes 713 through the polyimide resin 712 and also holes 719 communicated to the holes 713 in the copper foil 711 (FIG. 36B). Next, the copper foil 711 was partially etched to expand the holes 719, thereby forming concavities 714 (FIG. 36C).

Figure 36A:
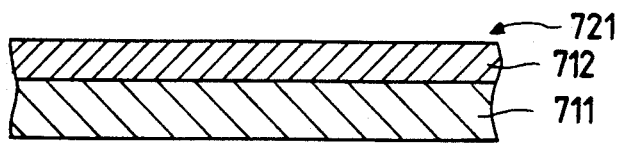
FIGS. 36A to 36F schematic sectional views showing the steps of the preparation process of another example according to the present invention.
Figure 36B:
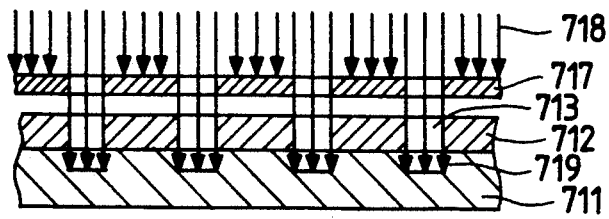
Figure 36C:
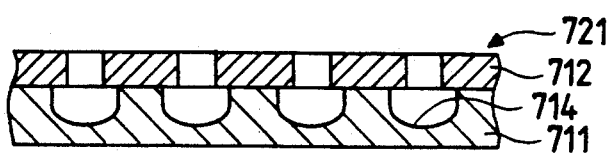
Figure 36D:
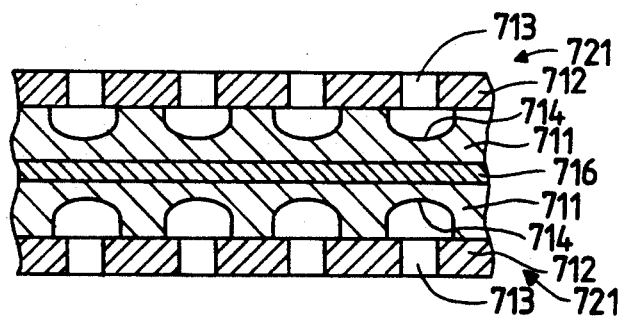
Figure 36E:
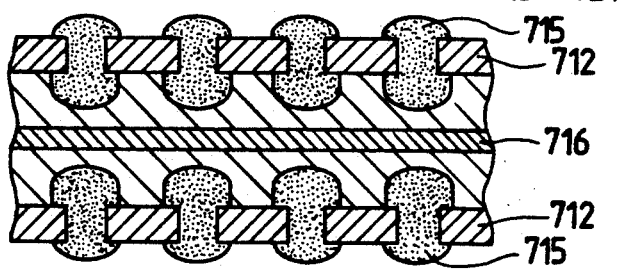
Figure 36F:
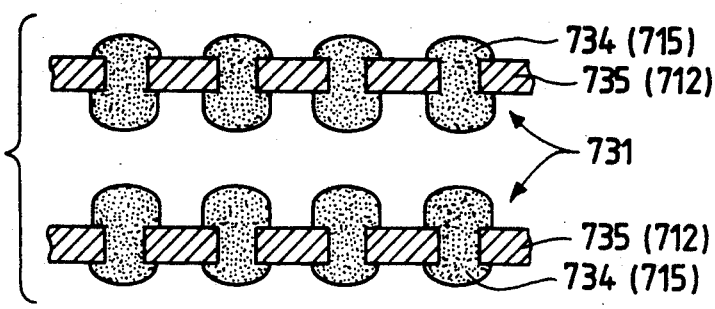

The two sheets of matrices 721 as shown in FIG. 36C thus prepared were plastered together with an adhesive 716 with contact between the surfaces where no polyimide resin 712 was provided (FIG. 36D). In Example 7, as different from Example 6, the two sheets of the matrix memberes 721 were adhered after formation of the concavities 714. Therefore, even for an electrical connecting member with different protruded amounts of the electroconductive members, concavities with desired shapes could be formed for the respective copper foils, and therefore it became possible to flow the gold plating liquid in the same way in the subsequent steps, whereby improvement of tact time could be effected to great extent. Then, similarly as in Example 6, gold 715 was filled into the holes 713 and the concavities 714 by gold plating (FIG. 36E), and finally the copper foils 711 and the adhesive 716 were etched away to prepare the electrical connecting members 731 (FIG. 36F).

Also in this Example, similarly as in Example 6, no masking was required in the formation step of the concavities and the gold plating step, whereby the problems of the prior art could be cancelled. As for penetration of the etchant in the etching removal step, the same effect as in Example 5 was obtained.

In Examples 1 to 7 as described above, gold (electroconductive member) was filled according to the plating method, but selective growth may be also performed according to other methods such as CVD (chemical vapor deposition).

In Examples 5, 6 and 7, an excimer laser beam such as KrF, ArF, etc. was used as the high energy beam, but any high energy beam having an energy enough to perforate the insulating layer (polyimide resin) and the base member (copper foil) to desired sizes may be employed. For example, other than excimer laser beam, there may be employed $CO_2$ laser beam, YAG laser beam, $N_2$ laser beam, Ar laser beam, Kr laser beam, etc. There are also those by use of ion beam such as focused ion beam etching (FIBE), ion beam etching (IBE), electron beam etching (EBE), sputtering etching, etc., and those by use of electric beam such as discharge working. Moreover, those by use of ion beam such as FIBE, EBE, etc. must make the atmosphere under vacuum state, while discharge working can perform fine hole working with difficulty due to the restrictions in working of probe, and therefore it is optimum for the present invention to employ a laser beam as the high energy beam.

The electrical connecting members prepared in Examples 1 to 7 as described above have a plurality of electroconductive members exposed on the holding member comprising an electrical insulating material. Some of them also have wiring pattern existing in the holding member. In such case, the wiring pattern may be present either internally of the holding member or on one or both surfaces of the holding member. The individual electroconductive members and the wiring patterns may be either electrically connected or not. Further, such electrical connection may be a connection internally of the holding member or alternatively on one surface or both surfaces of the holding member. The material of the wiring pattern is not limited to a metal material, but other electroconductive materials may be also employed. The end of the connecting portion of the electroconductive member may be preferably a convex shape. The electrical connecting member may comprise either one layer or a multi-layer of two or more layers.

In the respective examples as described above, gold was employed as the material for the electroconductive member, but other than gold (Au), metals or alloys such as Cu, Ag, Be, Ca, Mg, Mo, Ni, W, Fe, Ti, In, Ta, Zn, Al, Sn, Pb—Sn, etc. can be employed. The electroconductive member 84 may be formed of one kind of metals and alloys, or alternatively of a mixture of several kinds of metals and alloys. Also, a material comprising one or both of organic materials or inorganic materials incorporated in a metal material may be employed. The cross-sectional shape of the electroconductive member 34 can be made circular, square and other shapes, but in order to avoid excessive concentration of stress, a shape without corner is desirable. The electroconductive member 34 is not required to be arranged vertically into the holding member 35, but it may be oblique from one surface side of the holding member 35 to the other surface side of the holding member. The thickness of the electroconductive member 34 is not particularly limited. The exposed portion of the electroconductive member 34 may be made coplanar with the holding member 35, or protruded from the surface of the holding member 35. However, for ensuring reliability at the connecting by effecting stably connection with the connecting portion of electrical circuit parts, it is desirable that the electroconductive member 34 to be connected with the connecting portion of electrical circuit parts should be stably protruded from the holding member 35.

Further, in the respective examples as described above, as the photosensitive resin which is the holding member or the insulating layer, a polyimide resin was employed, but otherwise epoxy resins, silicone resins, etc. may be also employed. Also, one or plural kinds of inorganic materials, metallic materials, alloy materials shaped in desired forms such as powder, fiber, foil, bar, sphere, etc. may be also dispersed to be contained in such resins. Specific examples of metal materials and alloy materials to be contained may include Au, Ag, Cu, Al, Be, Ca, Mg, Mo, Fe, Ni, Co, Mn, W, Cr, Nb, Zr, Ti, Ta, Zn, Sn, Pb-Sn, etc., and inorganic materials may include ceramics such as $SiO_2$, $B_2O_3$, $Al_2O_3$, $Na_2O$, $K_2O$, CaO, ZnO, BaO, PbO, $Sb_2O_3$, $As_2O_3$, $La_2O_3$, $ZrO_2$, $P_2O_5$, $TiO_2$, MgO, SiC, BeO, BP, BN, AlN, $B_4C$, TaC, $TiB_2$, $CrB_2$, TiN, $Si_3N_4$, $Ta_2O_5$, etc., diamond, glass, carbon, boron, etc.

In the respective examples as described above, copper foil was employed as the base member, but this is not limitative, but thin foils of metals or alloys such as Au, Ag, Be, Ca, Mg, Mo, Ni, W, Fe, Ti, In, Ta, Zn, Al, Sn, Pb—Sn, etc. can be employed. However, since only the base member is selectively etched away in the final step, it is necessary that the material for the electroconductive members should be different from the material used for the base member.

As described in detail above, since two electrical connecting members can be prepared at once, it becomes possible to reduce the number of the steps as a whole, and a large amount of electrical connecting members can be prepared within a short time. In addition, since formation of a holding member with a desired film thickness, formation of uniform holes by exposure, developing processing under optimum conditions and adequate removal of etching residue, formation of concavities with sizes and shapes according to adequate etching treatment and formation of a large number of bumps with constantly optimum constant protruded heights and/or the protruded amounts at once by plating, etc. can be done, and therefore bumps with desired sizes and shapes can be produced in a large amount and also the yield during production can be improved, whereby narrow pitch formation becomes possible without short circuit through deformation during pressure adhesion mutually between the bumps of adjoining electroconductive members, and also since the protruded heights of the bumps are always predetermined amounts surely good connection with electrical circuit parts can be effected. Thus, the present invention exhibits excellent effects such as these and others.

Further, according to the present invention, since the internal stress of the photosensitive resin occurring in the course of preparation can be relaxed, there can be exhibited excellent effects suitable for mass production such that the electrical connecting members prepared in a large amount can be easily cut or divided, and otherwise that conveying and handling are possible without breaking the electrical connecting members.

What is claimed is:

1. A process for preparing an electrical connecting member having a holding member comprising an electrically insulating material, a plurality of electroconductive members equipped in said holding member under the state mutually insulated from each other, one end of said each electroconductive member being exposed at one surface of said holding member, and the other end of said each electroconductive member being exposed at the other surface of said holding member, said process comprising the steps of:

(A) constituting a matrix member by providing a photosensitive resin which becomes said holding member on both surfaces of a base member, respectively;
   (B) exposing and developing said respective photosensitive resins to form a plurality of holes through said photosensitive resins, thereby having said base member exposed;
   (C) curing said photosensitive resins;
   (D) etching away a part of said base member exposed;
   (E) filling an electroconductive member into said holes formed in said holding members coplanar with or protruded from said holding members; and
   (F) removing said base member which remains.

2. A process according to claim 1, wherein said step (A) is the step of providing a photosensitive resin which is thicker than the desired film thickness of said holding member and becomes said holding member on said base member.

3. A process according to claim 1, wherein said step (B) is the step of exposing said photosensitive resin by irradiation of a light with a energy density of 300 to 10,000 mJ/cm$^2$, then applying a wet developing processing for 4 to 30 minutes to form a plurality of holes through said photosensitive resins, thereby having said base member exposed.

4. A process according to claim 1, wherein said step (B) is the step of forming said holes by irradiation of a high energy beam.

5. A process according to claim 1, wherein said step (D) is the step of etching said base member so as to reduce the contact area between the residue in said holes formed in said step (B) and said base member, removing said residue by giving vibration to said residue and then having said base member exposed.

6. A process according to claim 1, wherein said step (D) is the step of etching said base member so as to reduce the contact area between the residue in said holes formed in said step (B) and said base member, and then having said base member exposed by etching away said residue.

7. A process according to claim 1, wherein said step (D) is the step of etching away a part of said base member exposed under a reduced pressure atmosphere of 700 mm Hg or lower.

8. A process according to claim 7, wherein said base member is vibrated in the process of being etched away.

9. A process according to claim 1, wherein said step (D) is the step of etching away a part of said base member exposed by carrying out chemical etching and electrolytic etching successively.

10. A process according to claim 9, wherein said chemical etching and said electrolytic etching are repeated for plural times.

11. A process according to claim 1, wherein said step (E) is the step of arranging said matrix member in shape of the side surface of a cylinder, and filling an electroconductive member into said holes by electroplating so as to be protruded from the surface of said insulating layer while rotating said cylinder.

12. A process according to claim 11, wherein the rotational direction of said matrix member is changed alternately.

13. A process according to claim 1 or 11, wherein said step (E) is the step of filing an electroconductive member by electroplating, and controlling at least one of the protruded height and the protruded amount of said electroconductive member from said holding member surface by previously measuring the relationship between the at least one of the protruded height and the protruded amount of said electroconductive member from said holding member surface and the plating bath voltage to be used for said plating.

14. A process according to claim 13, wherein said step (E) detects plating completion when the desired protruded height or the protruded amount of said electroconductive member from said holding member surface is obtained.

15. A process according to claim 1, having the step of forming cutting said holding in the thickness direction of the holding member at the portion except for the filled portion of said electroconductive member between said step (E) and said step (F).

16. A process according to claim 1, having the step of providing holes in said holding member at the portions except for the portions for mounting said electroconductive member between said step (E) and said step (F).

17. A process according to claim 1, wherein said step (F) is the step of removing the base member while leaving selectively the portion except for the filled portion of said electroconductive member to remain in said holding member.

18. A process according to claim 1, wherein said step (F) is the step of etching a part of said electroconductive member filled on said base member side after removal of said base member.

19. A process for preparing an electrical connecting member having a holding member comprising an electrically insulating material, a plurality of electroconductive members equipped in said holding member under the state mutually insulated from each other, one end of said each electroconductive member being exposed at one surface of said holding member, and the other end of said each electroconductive member being exposed at the other surface of said holding member, said process comprising the steps of:

(G) constituting a matrix member by providing a first photosensitive resin which becomes the first of said holding member on one surface of a base member;

(H) exposing and developing said first photosensitive resin to form a plurality of holes through said first photosensitive resin and have said base member exposed;

(I) providing a second photosensitive resin which becomes the second of said holding member on the other surface of said base member;

(J) exposing and developing said second photosensitive resin to form a plurality of holes through said second photosensitive resin and have said base member exposed;

(K) curing said first and second photosensitive resins;

(L) etching away a part of said base member exposed;

(M) filling an electroconductive member into said holes formed through said holding member so as to be coplanar with or protruded from the surfaces of said first and second holding members; and (N) removing said base members which remains.

20. A process according to claim 19, wherein said step (G) and said step (I) are the steps of providing photosensitive resins which become the first and second holding members onsaid base member thicker than the desired film thicknesses of said first and second holding members.

21. A process according to claim 19, wherein said step (H) and said step (J) are the steps of exposing said photosensitive resin by irradiation of a light with an energy density of 300 to 10,000 mJ/cm$^2$, then applying wet developing processing for 4 to 30 minutes to form a plurality of holes through said photosensitive resin, thereby having said base member exposed.

22. A process according to claim 19, wherein said step (H) and said step (J) are steps of forming said holes by irradiation of a high energy beam.

23. A process according to claim 19, wherein said step (L) is the step of etching said base member so as to reduce the contact area between the residue in said holes formed in said step (H) and said step (J) and said base member, and then removing said residue by giving vibration to said residue to have said base member exposed.

24. A process according to claim 19, wherein said step (L) is the step of etching said base member so as to reduce the contact area between the residue in said holes formed in said step (H) and said step (J) and said base member, and then etching away said residue to have said base member exposed.

25. A process according to claim 19, wherein said step (L) is the step of etching away a part of said base member exposed under a reduced atmosphere of 700 mm Hg or lower.

26. A process according to claim 25, wherein said base member is vibrated in said step of etching away.

27. A process according to claim 19, wherein said step (L) is the step of etching away a part of said base member exposed by performing chemical etching and electrolytic etching successively.

28. A process according to claim 27, wherein said etching including said chemical etching and said electrolytic etching is repeated for plural times.

29. A process according to claim 19, wherein said step (M) is the step of arranging said matrix member in shape of the side surface of a cylinder, and filling an electroconductive member into said holes by electroplating while rotating said cylinder so as to be protruded from the surface of said insulating layer.

30. A process according to claim 29, wherein the rotational direction of said matrix member is changed alternately.

31. A process according to claim 19 or 29, wherein said step (M) is the step of filling an electroconductive member by electroplating, and controlling at least one of the protruded height and the protruded amount of said electroconductive member from said first and second holding member surfaces by previously measuring the relationship between the at least one of the protruded height and the protruded amount of said electroconductive member from said holding member surface and the plating bath voltage to be used for said plating.

32. A process accoridng to claim 31, wherein said step (M) detects plating completion when the desired protruded height or the protruded amount of said electroconductive member from said holding member surface is obtained.

33. A process according to claim 19, having the step of forming cutting in said holding member in the thickness direction of the holding member at the portion except for the filled portion of said electroconductive member between said step (M) and said step (N).

34. A process according to claim 19, having the step of providing holes in said first and second holding members at the portions except for the portion for mounting said electroconductive member between said step (M) and said step (N).

35. A process according to claim 19, wherein said step (N) is the step of removing the base member while leaving selectively the portion except for the filled portion of said electroconductive member to remain in said first and second holding members.

36. A process according to claim 19, wherein said step (N) is the step of etching a part of said electroconductive member filled on said base member side after removal of said base member.

37. A process for preparing an electrical connecting member by forming a plurality of holes on a matrix member having a base member and a holding member comprising an insulating material laminated to have the surface of said base member exposed from the surface of said holding member, etching a plurality of concavities communicated to said plurality of holes on the surface of said base member, filling an electroconductive member into said plurality of holes so as to be protruded from said holding member surface, and then removing said base member from the back surface of said holding member with the other end of said electroconductive member protrude therefrom to have* both ends of said holding member protruded, said process comprising the step of plastering the surface on the holding member side of the first of said matrix member with the surface on the holding member side of the second of said matrix member.

38. A process according to claim 37, wherein said step is carried out after forming said holes for having the surface of said base member exposed.

39. A process according to claim 37, wherein said step is carried out after etching for forming said concavities.

40. A process according to claim 37, wherein said electrically insulating material is a photosensitive resin and said holes are formed by exposing and developing said photosensitive resin.

41. A process according to claim 40, wherein said holes are formed through said photosensitive resin by exposure of said photosensitive resin by irradiation of a light with an energy density of 300 to 10,000 mJ/cm² and applying a wet developing processing for 4 to 30 minutes.

42. A process according to claim 37, wherein said holes are formed by irradiation of a high energy beam.

43. A process according to claim 37, wherein said electrically insulating material is provided on said base member thicker than the desired film thickness of said holding member.

44. A process according to claim 37, wherein said concavities are formed by etching said base member so as to reduce the contact area between the residue within said holes and said base member, and then removing said residue by giving vibration to said residue.

45. A process according to claim 37, wherein said concavities are formed by etching said base member so as to reduce the contact area between the residue within said holes and said base member, and then etching away said residue.

46. A process according to claim 37, wherein said etching is applied on a part of said base member exposed under a reduced pressure atmosphere of 700 mm Hg or lower.

47. A process according to claim 37, wherein said base member is vibrated in the process of carrying out said etching.

48. A process according to claim 36 or 37, wherein said etching is practiced by carrying out chemical etching and electrolytic etching successively.

49. A process according to claim 48, wherein said etching is practiced by repeating said chemical etching and electrolytic etching successively for plural times.

50. A process according to claim 37, wherein said electroconductive member is filled into said holes by arranging said matrix member in shape of the side surface of a cylinder so as to be protruded from the surface of said insulating layer while rotating said cylinder.

51. A process according to claim 50, wherein the rotational direction of said matrix member is changed alternately.

52. A process according to claim 37 or 50, wherein said electroconductive member is filled by measuring previously the relationship between at least one of the protruded height and the protruded amount of said electroconductive member from the surface of said holding member and the plating bath voltage to be used for said plating, and controlling the at least one of the protruded height and the protruded amount of said electroconductive member from said holding member surface by detecting said plating bath voltage.

53. A process according to claim 52, wherein said electroconductive member is filled by measuring previously the relationship between at least one of the protruded height and the protruded amount of said electroconductive member from the surface of said holding member and the plating bath voltage to be used for said plating and detecting said plating bath voltage, and is completed when the desired protruded height or the protruded amount of said electroconductive member from said holding member surface is obtained.

54. A process according to claim 37, wherein cutting is formed on said holding member in the thickness direction at the portion except for the filled portion of said electroconductive member before removal of said base member.

55. A process according to claim 37, wherein the step of providing holes through said holding member at the portion except for the portion to be equipped with said electroconductive member before removal of said base member.

56. A process according to claim 37, wherein removal of said base member is the step of removing the base member while leaving selectively the portion except for the filled portion of said electroconductive member of said holding member to remain.

57. A process according to claim 37, wherein a part of said electroconductive member filled on said base member side is subjected to etching after removal of said base member.

58. A process for preparing an electrical connecting member having a holding member comprising an electrically insulating material, a plurality of electroconductive members equipped in said holding member under the state mutually insulated from each other, one end of said each electroconductive member being exposed at one surface of said holding member, and the other end of said each electroconductive member being exposed at the other surface of said holding member, said process comprising the steps of;
   (O) providing a photosensitive resin which becomes said holding member on a base member comprising a first layer and a second layer laminated thereon in contact with said first layer to constitute a matrix member;
   (P) exposing and developing said photosensitive resin to form a plurality of holes in said photosensitive resin, thereby having said first layer exposed;
   (Q) curing said photosensitive resin;
   (R) etching away a part of said first layer exposed by use of a first etchant with more rapid etching rate for said first layer than for said second layer, thereby having said second layer exposed;
   (S) removing a part of said second layer exposed by use of a second etchant different from said first etchant;
   (T) filling an electroconductive member into said holes formed in said holding member; and
   (U) removing said base member which remains.

59. A process according to claim 58, wherein said step (0) is the step of providing a photosensitive resin which becomes the holding member on said base member thicker than the desired film thickness of said holding member.

60. A process according to claim 58, wherein the step (Q) is the step of exposing said photosensitive resin by irradiation of a light with an energy density of 300 to 10,000 mJ/cm² and applying a wet developing processing for 4 to 30 minutes, thereby forming a plurality of holes in said photosensitive resin to have said base member exposed.

61. A process according to claim 58, wherein said holes are formed by irradiation of a high energy beam.

62. A process according to claim 58, wherein said step (R) and said step (S) are the steps of etching said base member so as to reduce the contact area between the residue within said holes formed in said step (P) and said base member, and then removing said residue by giving vibration to said residue, thereby having said base member exposed.

63. A process according to claim 58, wherein said step (R) and (S) are the steps of etching said base member so as to reduce the contact area between the residue within said holes formed in said step (P) and said base member, and then etching away said residue, thereby having said base member exposed.

64. A process according to claim 58, wherein said etching is applied on a part of said base member exposed under a reduced pressure atmosphere of 700 mm Hg, or lower.

65. A process according to claim 64, wherein said base member is vibrated in the process of carrying out said etching.

66. A process according to claim 58, wherein said step (R) and said step (S) are the steps of carrying out chemical etching and electrolytic etching successively, thereby etching away a part of said base member exposed.

67. A process according to claim 66, wherein said etching step including said chemical etching and electrolytic etching is repeated for plural times.

68. A process according to claim 58, wherein said step (T) is the step of filling the electroconductive member into said holes by arranging said matrix member in shape of the side surface of a cylinder so as to be protruded from the surface of said insulating layer while rotating said cylinder.

69. A process according to claim 68, wherein the rotational direction of said matrix member is changed alternately.

70. A process according to claim 58 or 68, wherein said step (T) is the step of filling the electroconductive member by electroplating, and controls at least one of the protruded height and the protruded amount of said electroconductive member from said holding member surface by measuring previously the relationship between the at least one of the protruded height and the protruded amount of said electroconductive member from the surface of said holding member and the plating bath voltage to be used for said plating.

71. A process according to claim 70, wherein said step (T) detects plating completion when the desired protruded height or the protruded amount of said electroconductive member from said holding member surface is obtained 72. A process according to claim 58, having the step of forming cutting on said holding member in the thickness direction at the portion except for the filled portion of said electroconductive member between said step (T) and said step (U).

73. A process according to claim 58, having the step of providing holes through said holding member at the portion except for the portion to be equipped with said electroconductive member between said step (T) and said step (U).

74. A process according to claim 58, wherein said step (U) is the step of removing the base member while leaving selectively the portion except for the filled portion of said electroconductive member of said holding member to remain.

75. A process according to claim 58, wherein said step (U) is the step of etching a part of said electroconductive member filled on said base member side after removal of said base member.

76. A process for preparing an electrical connecting member having a holding member comprising an electrically insulating material, a plurality of electroconductive members equipped in said holding member under the state mutually insulated from each other, one end of said each electroconductive member being exposed at one surface of said holding member, and the other end of said each electroconductive member being exposed at the other surface of said holding member, said process comprising the steps of:

(V) constituting a matrix member by use of a first layer and a second layer to constitute the matrix member so as to cover said first layer exposed on the both surfaces of a base member and providing a photosensitive resin on both surfaces of said base member in contact with said first layer;

(W) exposing and developing said photosensitive resin to form a plurality of holes in said photosensitive resins on both surfaces of said base member, thereby having said first layer exposed, and then curing said photosensitive resins;

(X) etching away a part of said first layer exposed by use of a first etchant which is more rapid in etching rate for said first layer than for said second layer to have said second layer exposed, and then etching away a part of said second layer exposed by use of a second etchant different from said first etchant;

(Y) filling an electroconductive member into said holes formed in said holding member; and (Z) removing said base member which remains.

77. A process according to claim 76, wherein said step (V) is the step of providing a photosensitive resin which becomes the holding member on said base member thicker than the desired film thickness of said holding member.

78. A process according to claim 76, wherein the step (W) is carried out by exposing said photosensitive resin by irradiation of a light with an energy density of 300 to 10,000 mJ/cm$^2$ and applying a wet developing processing for 4 to 30 minutes, thereby forming a plurality of holes in said photosensitive resin to have said base member exposed.

79. A process according to claim 76, wherein said step (X) includes the step of etching said base member so as to reduce the contact area between the residue in said holes formed in said step (W) and said base member, and then removing said residue by giving vibration to said residue to have said base member exposed.

80. A process according to claim 76, wherein said step (X) includes the step of etching said base member so as to reduce the contact area between the residue in said holes formed in said step (W) and said base member, and then etching away said base member to have said base member exposed.

81. A process according to claim 76, wherein said step (X) includes the step of etching away a part of said base member exposed under a reduced pressure atmosphere of 700 mm Hg or lower.

82. A process according to claim 76, wherein said base member is vibrated in the process of carrying out said etching.

83. A process according to claim 76 or 81, wherein said step (X) is the step of carrying out chemical etching and electrolytic etching successively, thereby etching away a part of said base member exposed.

84. A process according to claim 83, wherein said etching step including said chemical etching and electrolytic etching is repeated for plural times.

85. A process according to claim 76, wherein said step (Y) is the step of filling the electroconductive member into said holes by arranging said matrix member in shape of the side surface of a cylinder so as to be protruded from the surface of said insulating layer while rotating said cylinder.

86. A process according to claim 85, wherein the rotational direction of said matrix member is changed alternately.

87. A process according to claim 76 or 85, wherein said step (Y) is the step of filling the electroconductive member by electroplating, and controls at least one of the protruded height and the protruded amount of said electroconductive member from said holding member surface by measuring previously the relationship between the at least one of the protruded height and the protruded amount of said electroconductive member from the surface of said holding member and the plating bath voltage to be used for said plating.

88. A process according to claim 87, wherein said step (Y) detects plating completion when the desired protruded height or the protruded amount of said electroconductive member from said holding member surface is obtained.

89. A process according to claim 76, having the step of forming cutting on said holding member in the thickness direction at the portion except for the filled portion of said electroconductive member between said step (Y) and said step (Z).

90. A process according to claim 76, having the step of providing holes through said holding member at the portion except for the portion to be equipped with said electroconductive member between said step (Y) and said step (Z).

91. A process according to claim 76, wherein said step (Z) is the step of removing the base member while leaving selectively the portion except for the filled portion of said electroconductive member of said holding member to remain.

92. A process according to claim 76, wherein said step (Z) is the step of etching a part of said electroconductive member filled on said base member side after removal of said base member.

93. A process for preparing an electrical connecting member having a holding member comprising an electrically insulating material, a plurality of electroconductive members equipped in said holding member under the state mutually insulated from each other, one end of said each electroconductive member being exposed at one surface of said holding member, and the other end of said each electroconductive member being exposed at the other surface of said holding member, said process comprising the steps of:

constituting a matrix, member by providing an insulating layer which becomes said holding member on a base member;

forming a plurality of holes from the surface of said insulating layer to the inner portion of said base member;

arranging said matrix member in shape of the side surface of the cylinder, and filling an electroconductive member into said holes so as to be protruded from the surface of said insulating layer while rotating said cylinder; and removing said base member.

94. A process according to claim 93, wherein the rotational direction of said matrix member is changed alternately.

95. A process according to claim 93, wherein said electroconductive member is filled by previously measuring the relationship between at least one of the protruded height and the protruded amount of said electroconductive member from said holding member surface and the plating bath voltage to be used for said plating, and controlling the at least one of the protruded height and the protruded amount of said electroconductive member from said holding member surface.

96. A process according to claim 95, wherein filling of said electroconductive member is completed by detecting plating completion when the desired protruded height or the protruded amount of said electroconductive member from said holding member is obtained.

97. A process according to claim 93, wherein said insulating layer which becomes said holding member is provided on said base member thicker than the desired thickness.

98. A process according to claim 93, wherein said holes are formed by irradiation of a high energy beam.

99. A process according to claim 93, wherein said insulating layer is a photosensitive resin, and formed by exposing said photosensitive resin by irradiation of a light with an energy density of 300 to 10,000 mJ/cm$^2$, and then applying wet developing processing for 4 to 30 minutes, thereby having said base member exposed.

100. A process according to claim 93, wherein said base member is removed while leaving selectively the base member except for the filled portion of said electroconductive member of said holding member to remain.

* * * * *

UNITED STATES PATENT AND TRADEMARK OFFICE
CERTIFICATE OF CORRECTION

PATENT NO. : 5,145,552

DATED : September 8, 1992

INVENTOR(S) : TETSUO YOSHIZAWA ET AL.

It is certified that error appears in the above-identified patent and that said Letters Patent is hereby corrected as shown below:

On the Title page, item [73],

Assignee: Canon Kabushiki Kaisha, Tokyo, Japan" should read --Canon Kabushiki Kaisha, Tokyo; Sumitomo Metal Industries, Ltd., Osaka, both of Japan--.

COLUMN 1

Line 34, "member 36" should read --member 35--.

COLUMN 2

Line 12, "effects" should read --effect--.
Line 31, "pre-backed" should read --pre-baked--.

COLUMN 3

Line 16, "filing" should read --filling--.
Line 23, "each" should read --reach--.

COLUMN 4

Line 3, "apperatus" should read --apparatus--.
Line 4, "foild" should read --foiled--.
Line 21, "resing" should read --resin--.
Line 29, "disired" should read --desired--.
Line 32, "residula" should read --residual--.
Line 51, "adsorved" should read --absorbed--.

UNITED STATES PATENT AND TRADEMARK OFFICE
CERTIFICATE OF CORRECTION

PATENT NO. : 5,145,552

DATED : September 8, 1992

INVENTOR(S) : TETSUO YOSHIZAWA ET AL.

It is certified that error appears in the above-identified patent and that said Letters Patent is hereby corrected as shown below:

COLUMN 5

Line 2, "ethcing" should read --etching--.
    Line 7, "ununform." should read --ununiform.--.
    Line 16, "memberr 51," should read --member 51,--.
    Line 25, "was occurred." should read --occurred.--.
    Line 44, "broughy" should read --brought--.
    Line 45, "trocondcutive" should read --troconductive--.

COLUMN 6

Line 6, "porses" should read --pores--.
    Line 7, "veriety" should read --variety--.
    Line 34, "obtained" should read --obtain--.
    Line 36, "concelling" should read --cancelling--.
    Line 44, "developint" should read --developing--.
    Line 63, "end" should read --and--.

COLUMN 7

Line 9, "shpes" should read --shapes--.
    Line 39, "sectinonal" should read --sectional--.
    Line 45, ""9 B" should read --9B--.
    Line 63, "sectinal" should read --sectional--.

COLUMN 8

Line 20, "FIG. 23F" should read --FIG. 23;--.
    Line 47, "schematic" should read --are schematic--.
    Line 50, "schematic" should read --are schematic--.
    Line 58, "whic" should read --which--.
    Line 64, "copper-foil 101" should read
            --copper foil 101--.

UNITED STATES PATENT AND TRADEMARK OFFICE
CERTIFICATE OF CORRECTION

PATENT NO. : 5,145,552
DATED : September 8, 1992
INVENTOR(S) : TETSUO YOSHIZAWA ET AL.

It is certified that error appears in the above-identified patent and that said Letters Patent is hereby corrected as shown below:

COLUMN 9

Line 20, "secitonal" should read --sectional--.
Line 34, "effect." should read --effect--.

COLUMN 12

Line 54, "describe" should read --described--.

COLUMN 13

Line 21, "foild" should read --foiled--.
Line 61, "The" should read --the-- and "teh humps 105a" should read --the bumps 105a--.
Line 63, "stpes," should read --steps,--.

COLUMN 14

Line 5, "foild" should read --foiled-- and "memeber" should read --member--.
Line 8, "foild," should read --foiled,--.
Line 9, "aslo" should read --also--.
Line 12, "cancavities" should read --concavities--.
Line 16, "leectroconductive" should read --electroconductive--.
Line 60, "columner" should read --columnar--.

UNITED STATES PATENT AND TRADEMARK OFFICE
CERTIFICATE OF CORRECTION

PATENT NO. : 5,145,552

DATED : September 8, 1992

INVENTOR(S) : TETSUO YOSHIZAWA ET AL.          Page 4 of 6

It is certified that error appears in the above-identified patent and that said Letters Patent is hereby corrected as shown below:

COLUMN 15

Line 4, "foild" (both occurrences) should read --foiled--.
Line 55, "form" should read --from--.
Line 65, "juxteposed" should read --juxtaposed--.

COLUMN 16

Line 9, "portio" should read --portion--.
Line 10, "wit hthe" should read --with the--.
Line 19, "is" should read --are--.
Line 30, "then" should read --than--.
Line 34, "electroconductiv" should read --electroconductive--.
Line 37, "iwth" should read --with--.

COLUMN 17

Line 50, "by-one" should read --by one--.

COLUMN 19

Line 5, "member" should read --members--.

COLUMN 20

Line 13, "IC chip." should read --an IC chip.--.
Line 27, "meber 102" should read --member 102--.

UNITED STATES PATENT AND TRADEMARK OFFICE
CERTIFICATE OF CORRECTION

PATENT NO. : 5,145,552

DATED : September 8, 1992

INVENTOR(S) : TETSUO YOSHIZAWA ET AL.

It is certified that error appears in the above-identified patent and that said Letters Patent is hereby corrected as shown below:

COLUMN 22

Line 28, "copper-foil" should read --copper foil--.

COLUMN 23

Line 50, "he" should read --the--.

COLUMN 24

Line 32, "(FIG. 350)." should read --(FIG. 35C).--.

COLUMN 25

Line 1, "memberes 721" should read --members 721--.

COLUMN 26

Line 40, "AIN," should read --AlN,--.

COLUMN 27

Line 49, "a" (second occurrence) should read --an--.

COLUMN 28

Line 39, "forming cutting" should read --cutting in-- and "holding" should read --holding member--.

UNITED STATES PATENT AND TRADEMARK OFFICE
CERTIFICATE OF CORRECTION

PATENT NO. : 5,145,552

DATED : September 8, 1992

INVENTOR(S) : TETSUO YOSHIZAWA ET AL.   Page 6 of 6

It is certified that error appears in the above-identified patent and that said Letters Patent is hereby corrected as shown below:

COLUMN 29

Line 18, "members" should read --member--.
    Line 22, "onsaid" should read --on said--.

COLUMN 30

Line 20, "forming cutting" should read --cutting--.
    Line 50, "protrude" should read --protruded-- and "have*" should read --have--.

COLUMN 33

Line 41, "forming cutting" should read --cutting--.

COLUMN 36

Line 1, "matrix," should read --matrix--.
    Line 8, "the" should read --a--.

Signed and Sealed this

Second Day of November, 1993

Attest:

BRUCE LEHMAN

*Attesting Officer*   Commissioner of Patents and Trademarks